(12) United States Patent
Arimoto et al.

(10) Patent No.: US 6,486,493 B2
(45) Date of Patent: Nov. 26, 2002

(54) SEMICONDUCTOR INTEGRATED CIRCUIT DEVICE HAVING HIERARCHICAL TEST INTERFACE CIRCUIT

(75) Inventors: Kazutami Arimoto, Hyogo (JP); Hiroki Shimano, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/942,827

(22) Filed: Aug. 31, 2001

(65) Prior Publication Data

US 2002/0047137 A1 Apr. 25, 2002

(30) Foreign Application Priority Data

Sep. 8, 2000 (JP) ........................................ 2000-273016
Mar. 27, 2001 (JP) ........................................ 2001-090589

(51) Int. Cl.[7] .............................................. H01L 23/58
(52) U.S. Cl. .......................... 257/48; 257/203; 365/201
(58) Field of Search ........................ 257/213, 48, 203; 365/201

(56) References Cited

U.S. PATENT DOCUMENTS 6,301,171 B2 * 10/2001 Kim et al. .................. 365/201

FOREIGN PATENT DOCUMENTS

JP           11-250700           9/1999

* cited by examiner

*Primary Examiner*—Roy Potter
(74) *Attorney, Agent, or Firm*—McDermott, Will & Emery

(57) ABSTRACT

A plurality of test interface circuits are disposed in correspondence with a plurality of DRAM cores. An upper test interface circuit transmits a test control signal or the like supplied from the outside to each of or one of the plurality of test interface circuits in accordance with a memory core selection signal. When all of the DRAM cores are designated as targets of an operation test, test output data from the DRAM cores is compared with each other by a data comparing circuit and is outputted as judge flag data reflecting the result of the comparison to the outside.

17 Claims, 16 Drawing Sheets

MEMORY TESTER CAN
DIRECTLY ACCESS
TO DRAM CORE MCR

SEMICONDUCTOR INTEGRATED CIRCUIT DEVICE HAVING HIERARCHICAL TEST INTERFACE CIRCUIT

BACKGROUND OF THE INVENTION

1. Field of the Invention

The present invention relates to a semiconductor integrated circuit device and, particularly, a system LSI on which a memory is mounted. More particularly the invention relates to a configuration of a test interface circuit for conducting an operation test of a memory in the system LSI.

2. Description of the Background Art

A system LSI such as a logic-merged DRAM obtained by integrating a memory core such as a large-capacity dynamic random access memory (DRAM) and a logic device such as a processor or ASIC (Application Specific Integrated Circuit) on the same semiconductor chip (semiconductor substrate) has been developed. Such a system LSI can realize high data transfer speed which is higher than that of a general DRAM by one or two digits by connecting the logic device and the memory such as a DRAM to each other via an internal data bus having a wide data bit width of 128 to 512 bits.

The DRAM and the logic device are connected to each other via an internal wire, and the internal wire is sufficiently short as compared with a wire on the board and has a small parasitic capacitance. Consequently, large reduction in charging/discharging currents in the internal wire and high-speed signal transmission can be realized. The number of external pin terminals of the logic device can be reduced as compared with a method of connecting an external general DRAM to a logic device. For the reasons, the system LSI such as a logic-merged DRAM greatly contributes to higher performance of information equipment dealing with a large amount of data in a three-dimensional graphics process, image/voice processes, and the like.

In the system LSI such as a logic-merged DRAM, only the logic device is mounted to a terminal via a pad. In the case of conducting an operation test on a memory such as a built-in DRAM, the test has to be carried out via the logic device. In this case, however, the control of the operation test is performed by the logic device, so that a load on the logic device increases. Specifically, in the case of conducting the operation test via the logic device, the following need arises. A command to conduct the operation test on the memory such as a DRAM is given from the outside to the logic device, a control signal for conducting the operation test is supplied from the logic device to the memory, and the test result is outputted to the outside by the logic device.

The operation test on the memory in the system LSI as a logic-mounted DRAM is therefore conducted via the logic device. It is consequently difficult to carry out a test of an operation timing margin or the like on the memory with high accuracy.

From the viewpoint of a program capacity as well, the number of test patterns generated by the logic device is limited, so that a sufficient operation test cannot be conducted. Due to the factors, it is difficult to sufficiently guarantee the reliability of the memory such as a DRAM. When the gate scale increases, a defect occurrence probability of the logic device itself becomes high, so that the reliability of the memory test deteriorates. Consequently, a need for conducting a test directly on the memory such as a DRAM from the outside by a dedicated tester such as a memory tester arises. Such a test is also called a direct memory access test.

FIG. 16 is a diagram schematically showing the configuration of a conventional DRAM-mounted system LSI 900.

Referring to FIG. 16, the system LSI 900 includes: a large-scale logic LG which is coupled to an external pin terminal group LPGA and executes an instructed process; an analog core ACR which is coupled between the large-scale logic device LG and an external pin terminal group APG and performs a process of an analog signal; a DRAM core MCR which is coupled to the large-scale logic LG device via internal wires and stores data necessary for the large-scale logic device LG; and a test interface circuit TIC which disconnects the large-scale logic device LG and the DRAM core MCR from each other and couples an external memory tester to the DRAM core MCR via a test pin terminal group TPG at the time of an operation test. The DRAM core MCR receives a power supply voltage VCC via a power supply pin terminal PST.

The analog core ACR includes a phase locked loop (PLL) circuit for generating an internal clock signal, an analog-to-digital converter for converting an analog signal from the outside into a digital signal, and a digital-to-analog converter for converting a digital signal supplied from the large-scale logic LG to an analog signal and outputting the analog signal.

The DRAM core MCR is a synchronous DRAM (SDRAM) which takes in an operation mode instruction signal and receives/transmits data synchronously with a supplied clock signal.

The large-scale logic LG device includes a memory control unit for executing a process such as an image/voice information process and controlling an access to the DRAM core MCR.

As shown in FIG. 16, by providing the test interface circuit TIC, the DRAM core MCR is completely disconnected from the logic device (large-scale logic device LG), so that the DRAM core MCR can be directly accessed via the test pin terminal group TPG. Consequently, the DRAM core MCR can be controlled and monitored directly from the outside by a memory tester or the like. By providing the test interface circuit TIC, according to a direct memory access test, an operation test which is substantially the same as that conducted on a general DRAM (SDRAM) by using a conventional memory tester can be conducted.

FIG. 17 is a diagram showing the configuration of the test interface circuit TIC and its related portion illustrated in FIG. 16.

Referring to FIG. 17, the test pin terminal group TPG includes: a pin terminal for receiving a test clock signal TCLK; a pin terminal for receiving a test control signal TCMD which designates a test operation mode; a pin terminal for receiving a test address TAD which designates a memory cell to be accessed in the DRAM core MCR in a test mode; a pin terminal for receiving write data (test input data) TDin at the time of an operation test; and a pin terminal for receiving test output data TDout from the test interface circuit TIC at the time of an operation test.

Each of the test input data TDin supplied to the test interface circuit TIC and the test output data TDout outputted from the test interface circuit TIC is set to have a bit width of, for example, eight bits in a manner similar to a general DRAM.

The test interface circuit TIC includes a latch/command decoder 1 for performing data processes of taking in the test control signal TCMD, test address TAD, and test input data TDin supplied to the test pin terminal group TPG synchronously with the test clock signal TCLK, decoding the test control signal to an internal command (operation mode signal) so as to be issued to the DRAM core MCR, expanding the 8-bit test input data TDin to write data of 256 bits, and the like.

The test interface circuit TIC further includes: a mode register 2 for storing information such as column latency of the DRAM core MCR; a CA shifter 3 for generating a read data selection signal RD_S by shifting a read selection signal supplied from the latch/command decoder 1 in accordance with the column latency information stored in the mode register 2; and a read data selection circuit 4 for performing 256:8 test output data selection of selecting 8-bit data from 256-bit data read from the DRAM core MCR in accordance with the read data selection signal RD_S from the CA shifter 3.

As test peripheral circuits, provided are: a selector 5 for selectively coupling the DRAM core MCR to one of the large-scale logic device and the test interface circuit TIC in response to a test mode instruction signal TE; a gate circuit 6 which receives a clock signal CLK supplied from, for example, the large-scale logic device in an ordinary operation mode and the test clock TCLK supplied at the time of the operation test and supplies an operation clock signal DCLK to the DRAM core MCR; and a gate circuit 7 for transmitting 256-bit read data RD read from the DRAM core MCR to the test interface circuit TIC when the test mode instruction signal TE is activated.

The 256-bit read data RD read from the DRAM core MCR is supplied to the large-scale logic device not through the selector 5 in order to supply the read data to the large-scale logic device at high speed at the time of the ordinary operation.

The DRAM core MCR takes in supplied data and signals and outputs the read data RD synchronously with the operation clock signal DCLK outputted from the gate circuit 6.

FIG. 18 is a diagram more specifically showing the configuration of the latch/command decoder illustrated in FIG. 17.

Referring to FIG. 18, the latch/command decoder 1 includes: a latch circuit 1a for taking in and latching the test control signal TCMD, the test address TAD, and the test input data TDin which are supplied to the test pin terminal group TPG in response to the rising edge of the test clock signal TCLK; a command decoder 1b for receiving and decoding a predetermined bit in the test control signal TCMD and the test address TAD from the latch circuit 1a and generating a command of designating an operation mode; a bit width expanding circuit 1c for expanding the 8-bit test input data TDin from the latch circuit 1a to 256-bit write data; and a latch circuit 1d for taking in and latching output signals of the command decoder 1b and the bit width expanding circuit 1c in response to the trailing edge of the test clock signal TCLK.

A test command TIFCMD, a test interface address TIFAD, and test input data TIFDin are outputted from the latch circuit 1d and are supplied to the DRAM core MCR via the selector 5. A command from the command decoder 1b is also supplied to the mode register 2. When a mode register set mode is designated, an address bit, test data, or the like is stored into the mode register 2.

As described above, the latch circuit 1a enters a latch state (or a through state) in response to the rising edge of the test clock signal TCLK. The latch circuit 1d enters a latch state (or a through state) in response to the falling edge of the test clock signal TCLK so as to be complementary to the latch circuit 1a.

The command decoder 1b receives the test control signal TCMD and a predetermined address bit and generates an internal command for designating an operation mode, a row active command ACT, a bank precharge command PRE, a write command WRITE, a read command READ, an auto refresh command REFA, and the like.

FIG. 19 is a timing chart for explaining operations of the test interface circuit shown in FIG. 17.

As shown in FIG. 17, the DRAM core MCR transfers write data INDin and read data RD via different buses. As for the test pin terminal group TPG as well, the test input data TDin and the test output data TDout at the time of a test is transferred via different pin terminals. It is assumed here that a test instruction to the DRAM core is supplied from an external memory tester.

An operation of reading data from the DRAM core at the time of an operation test will be described first.

Referring to FIG. 19, in dock cycle #1, in order to instruct the DRAM core MCR to read data, the test control signal TCMD for generating the read command (reading operation instructing signal) READ is supplied. The test control signal TCMD supplied in clock cycle #1 is supplied as an internal command INCMD indicative of the read command READ from the test interface circuit TIC via the selector 5 to the DRAM core MCR.

At the time of the operation test, the selector 5 disconnects the large-scale logic device and the DRAM core MCR in accordance with the test mode instruction signal TE, selects the test interface command (test operation mode instructing signal) TIFCMD, the test interface address TIFAD, and the test interface input data TIFDin outputted from the test interface circuit TIC and transfers them to the DRAM core MCR.

The gate circuit 7 transmits the data RD read from the DRAM core MCR to the test interface circuit TIC in accordance with the test mode instruction signal TE. The DRAM core MCR reads internal data in accordance with the internal address INADD which is simultaneously supplied synchronously with the operation clock signal DCLK sent from the gate circuit 6. When column latency CL of the DRAM core MCR is equal to two clock cycles (in the following, such a case will be also simply described as "in the case of CL=2"), in accordance with the internal read command READ (INCMD) supplied in the clock cycle #2, effective read data is outputted at the rising edge of the test clock signal TCLK in clock cycle #4.

In the test interface circuit TIC, the CA shifter 3 shifts the read data selection signal RD_S generated from the upper five bits of the column address included in the test address TAD for a period of the clock cycles of the column latency CL in accordance with the test clock signal TCLK. When the read data selection signal RD_S is generated from the test address TAD, delay time in the test interface circuit TIC is included in accordance with the shift period. The delay time is written as "TIC delay" in FIG. 19.

At a timing when the 256-bit read data RD from the DRAM core MCR arrives at the read data selection circuit 4 via the gate circuit 7, that is, in clock cycle #4, the read data selection signal RD_S from the CA shifter 3 also enters a valid state. In response to this, the read data selection circuit 4 selects 8-bit data in accordance with a read data selection signal RD_S (<0>) from the 256-bit data and transmits the selected data as test output data TDout (D00) to a pin terminal.

An operation of writing data to the DRAM core at the time of the operation test will now be described.

In dock cycle #2, the test control signal TCMD indicative of writing of data is supplied from an external memory tester to the DRAM core MCR. The test control signal TCMD is decoded to the write command (operation mode instruction signal) WRITE indicative of writing of data by the latch/command decoder 1. When the write command is supplied, the test input data TDin(DA) is also simultaneously supplied to the test pin terminal group TPG. The write command WRITE and the test write data DA are also transferred synchronously with the test clock signal TCLK in the test interface circuit TIC.

In the latch/command decoder 1, the 8-bit test input data DA (TDin) is converted to the 256-bit internal write data DAin by the bit width expanding circuit 1c. That is, an 8-bit data line is expanded and developed to a 256-bit data line.

Further, the test control signal TCMD to be decoded to the read command READ for instructing reading of data is supplied from the external memory tester in clock cycle #3. In the following clock cycle #4, a test control signal to be decoded to the write command WRITE for instructing writing of data is supplied.

In this case, in clock cycle #5, internal write data DBin is supplied to the DRAM core MCR. In clock cycle #6, the 256-bit data Dout is read from the DRAM core MCR and 8-bit read data D01 selected in accordance with a read data selection signal RD_S(<1>) by the read data selection circuit 4 is outputted as the test output data TDout from the test pin terminal group TPG.

The mode register 2 stores data indicative of the number of clock cycles of the TIC delay (one clock cycle in FIG. 19) and the column latency CL. The CA shifter 3 performs a shifting operation in accordance with the test clock signal TCLK for a period corresponding to the data stored in the mode register 2, thereby enabling the data RD read from the DRAM core MCR to be selected at an accurate timing and the test output data TDout to be outputted.

By providing the test interface circuit TIC as described above, the DRAM core MCR can be directly accessed from an external memory tester, so that the direct memory access test can be conducted. The operation test necessary for the DRAM core MCR provided in the system LSI can be therefore conducted by using a general SDRAM memory tester.

There is also a system LSI on which a plurality of memory cores having different memory capacities, data buses, column latencies, and operation frequencies are mounted. An example is a three-dimensional graphics LSI on which not only a main memory but also a frame buffer memory used as a work memory of a rendering machine, a Z buffer memory used for hidden-surface removal, and the like are mounted.

On each of the plurality of memory cores on such a system LSI, an independent operation test which is a direct memory access test via the test interface circuit TIC provided for each of the memory cores can be carried out.

In order to complete the operation tests on the plurality of memory cores, however, it is necessary to conduct the operation tests of the number corresponding to the number of memory cores. It causes a problem such that test time and the cost of the test accordingly increases.

SUMMARY OF THE INVENTION

It is an object of the invention to provide a configuration of a test interface circuit capable of conducting an operation test simultaneously on a plurality of memory cores (memory circuits) in a semiconductor integrated circuit device on which the plurality of memory cores are mounted.

The present invention is summarized as follows. The invention provides a semiconductor integrated circuit device comprising a plurality of memory circuits, a plurality of test interface circuits, and a high-order test interface circuit. Each of the plurality of memory circuits operates synchronously with an operation clock signal and executes a given operation instruction. The plurality of test interface circuits are provided in correspondence with the plurality of memory circuits, each for supplying an operation instruction as well as inputting and outputting test data to and from a corresponding one of the plurality of memory circuits in an operation test. The upper test interface circuit can supply an operation instruction based on a test operation instruction and input and output test data to each of the plurality of test interface circuits in the operation test. The upper test interface circuit includes a data comparing circuit for judging based on comparison among plural data outputted from the plurality of test interface circuits.

Therefore, a major advantage of the invention is that, since the operation instruction can be supplied and data can be received/transmitted simultaneously from/to the plurality of test interface circuits, an operation test simultaneously on the plurality of memory circuits as targets can be conducted.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described in detail hereinbelow with reference to the drawings.

First Embodiment

Figure 1:
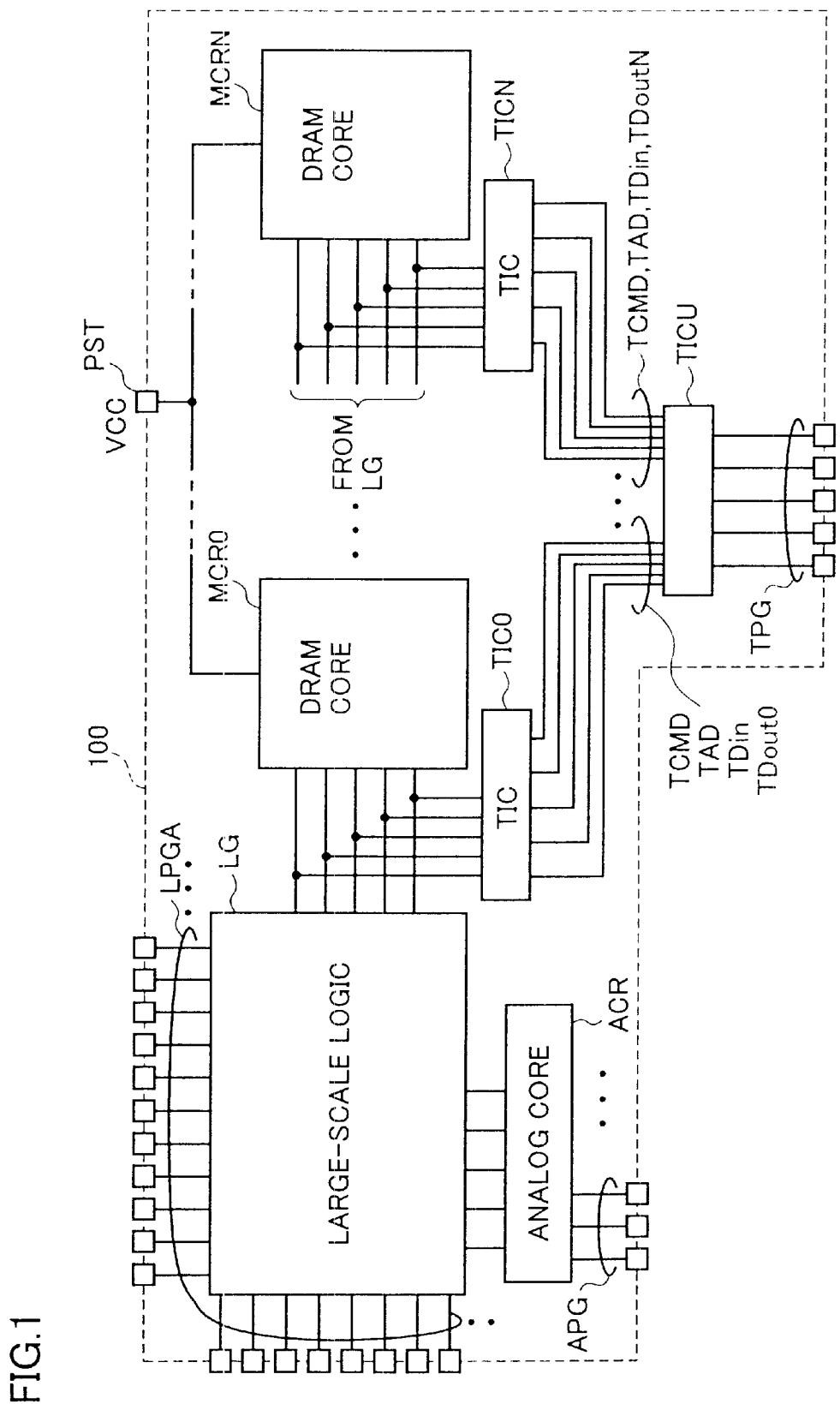
FIG. 1 is a schematic block diagram showing the configuration of a semiconductor integrated circuit device 100 according to a first embodiment of the invention.

Referring to FIG. 1, a semiconductor integrated circuit device 100 according to a first embodiment of the invention has: a large-scale logic device LG coupled to an external pin terminal group LPGA; an analog core ACR coupled between an external pin terminal group APG and the large-scale logic device LG; and a plurality of DRAM cores MCR0 to MCRN (N: natural number). The semiconductor integrated circuit device 100 further includes: test interface circuits TIC0 to TICN provided in correspondence with the DRAM cores MCR0 to MCRN, respectively; and an upper test interface circuit TICU coupled to a test pin terminal group TPG.

The upper test interface circuit TICU is provided between the test interface circuits TIC0 to TICN and the test pin terminal group TPG. The upper test interface circuit TICU receives the test dock signal TCLK, test control signal TCMD, test address TAD, and test input data TDin which are supplied from a memory tester or the like on the outside via the test pin terminal group TPG. The upper test interface circuit TICU transmits the test clock signal TCLK, test control signal TCMD, test address TAD, and test input data TDin to each of or selected one of the test interface circuits TIC0 to TICN in accordance with a signal designating a DRAM core targeted for an operation test, which is similarly supplied from the outside.

At the time of an operation test, test output data TDout1 to TDoutN corresponding to the DRAM cores MCR0 to MCRN, respectively, is outputted to the upper test interface circuit TICU by the test interface circuits TIC0 to TICN. In the case of generically calling the test output data TDout1 to TDoutN, it will be simply described as test output data TDout.

The upper test interface circuit TICU outputs the test output data TDout from the DRAM core targeted for the operation test to the external memory tester or the like via the test pin terminal group TPG. The configuration and operation of the upper test interface circuit TICU will be specifically described hereinlater.

Figure 16:
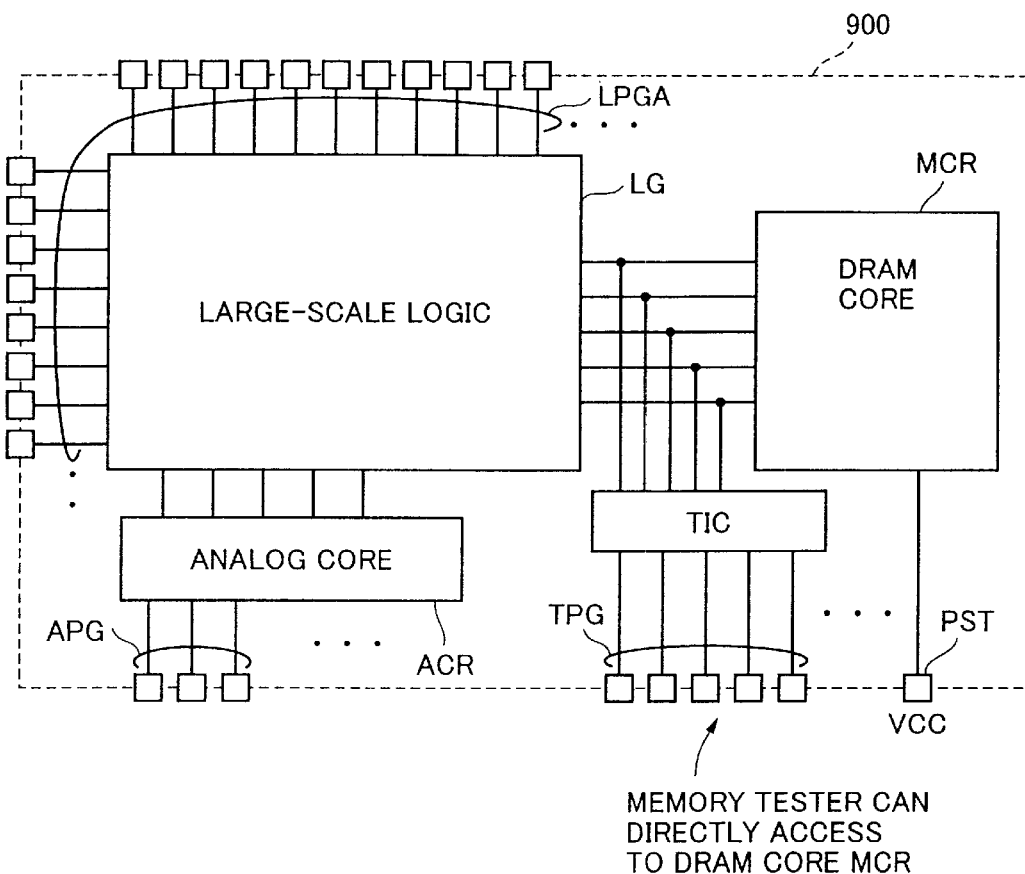
FIG. 16 is a block diagram schematically showing the configuration of a conventional DRAM-mounted system LSI 900.
Figure 17:
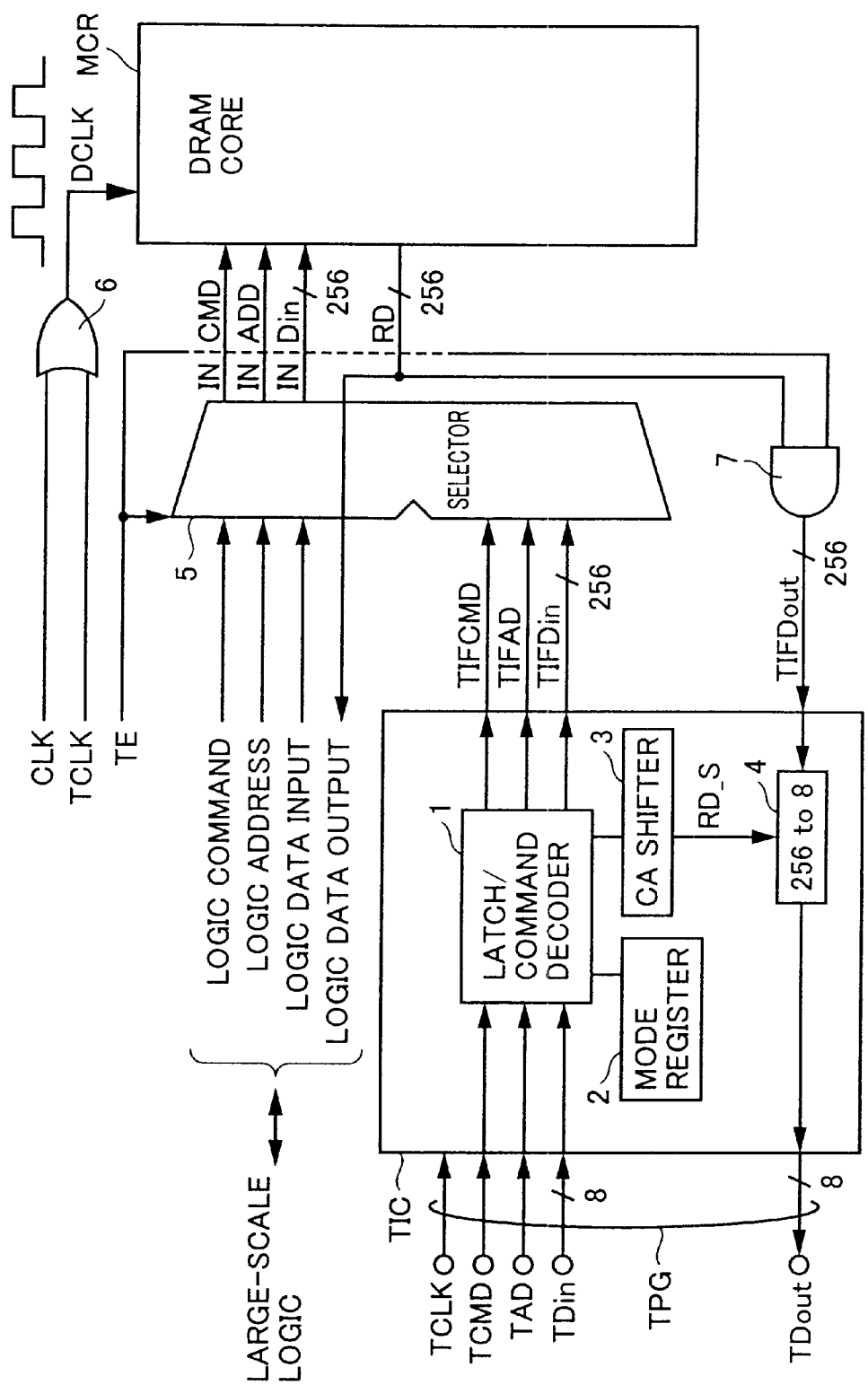
FIG. 17 is a block diagram showing the configuration of a test interface circuit TIC and its related portion illustrated in FIG. 16.
Figure 18:
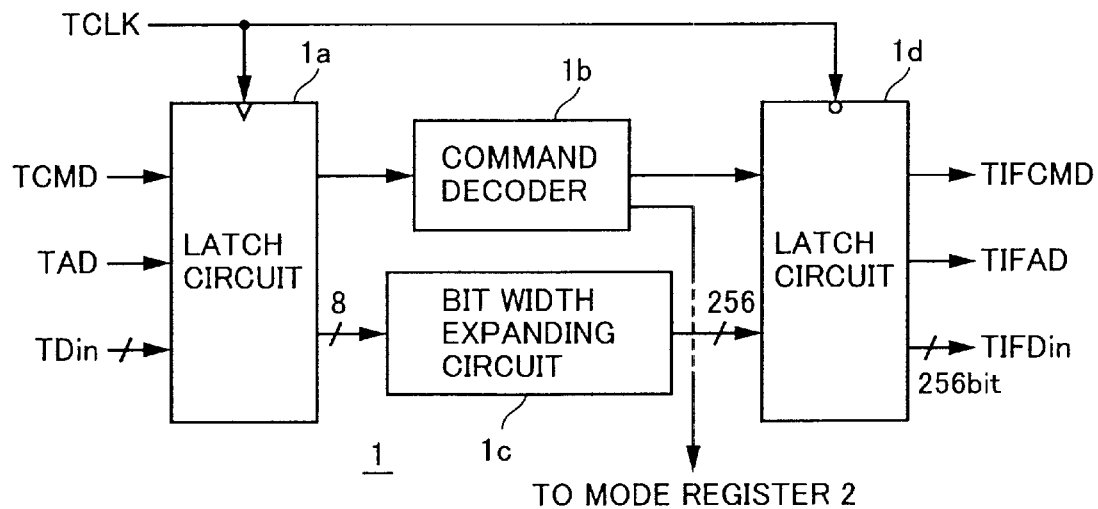
FIG. 18 is a block diagram more specifically showing the configuration of a latch/command decoder illustrated in FIG. 17.

Since the functions of the large-scale logic device LG and the analog core ACR are as described above by referring to FIG. 16, the detailed description is not repeated here. Since the configuration of the test interface circuits TIC0 to TICN and the connecting relation between the test interface circuits TIC0 to TICN and the corresponding DRAM cores MCR0 to MCRN are as shown in FIG. 17, the detailed description will not be repeated. The power supply voltage VCC is supplied to the DRAM cores MCR0 to MORN via the power supply pin terminal PST.

The configuration of the DRAM core will now be described.

Although the capacities, operation frequencies, and column latencies of the DRAM cores MCR0 to MCRN may different from each other, it is assumed that the basic configurations of the DRAM cores MCR0 to MCRN are similar to each other. The DRAM cores MCR0 to MCRN will be therefore collectively described as MCR and the configuration of the MCR will be described.

Figure 2:
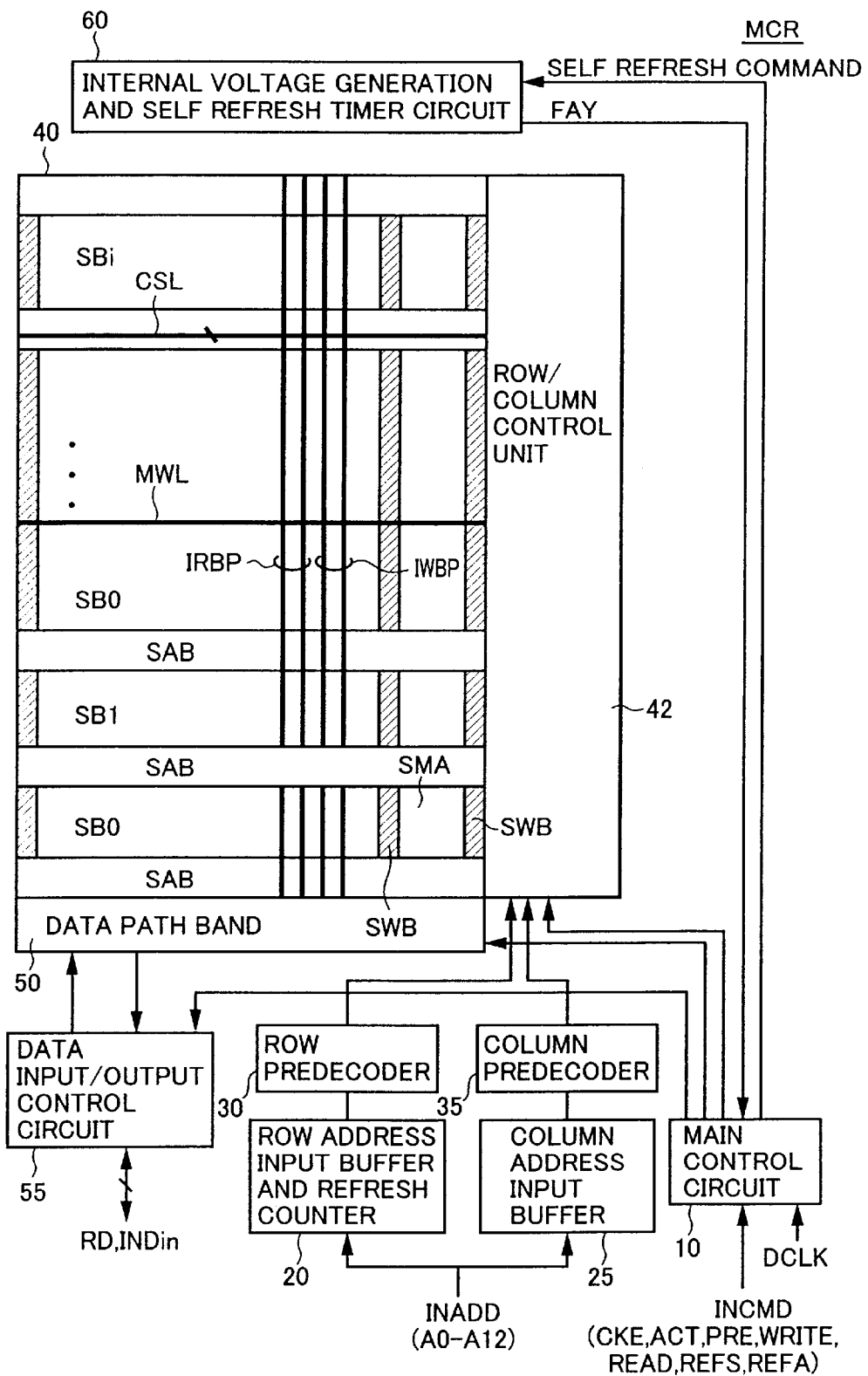
FIG. 2 is a block diagram for explaining the configuration of a DRAM core.

Referring to FIG. 2, the DRAM core MCR has a main control circuit 10 which receives the internal command INCMD from the selector 5 and controls the whole operations of the DRAM core MCR. The internal command INCMD is given from the logic device LG in a normal operation. The read data RD is directly transmitted to the logic device LG in the normal operation.

As already described, at the time of the operation test, the test interface command (test operation mode instructing signal) TIFCMD, test interface address TIFAD, and test interface input data TIFDin outputted from the test interface circuit TIC are supplied as the internal command INCMD, internal address INADD, and write data INDin, respectively, to the DRAM core MCR via the selector 5. The read data RD is transmitted to the corresponding test interface circuit.

The internal commands INCMD include the above-described row active command ACT, bank precharge command PRE, write command WRITE, read command READ, auto refresh command REFA, and self refresh command REFS. The main control circuit 10 takes in the internal commands INCMD synchronously with the operation clock signal DCLK outputted from the gate circuit 6 and latches them.

The main control circuit 10 activates a plurality of internal operation control signals corresponding to the latched internal commands INCMD.

The DRAM core MCR also has: a row address input buffer and refresh counter 20 which receives the internal address INADD from the selector 5 as a row address; and a column address input buffer 25 which receives the internal address INADD as a column address. Each of the row address input buffer and refresh counter 20 and the column address input buffer 25 latches the taken internal address INADD. The DRAM core MCR further includes a row predecoder 30 and a column predecoder 35 for predecoding the addresses latched by the row address input buffer and refresh counter 20 and the column address input buffer 25, respectively.

The DRAM core MCR further has a memory array 40 in which a plurality of memory cells for storing data are arranged. The memory array 40 is divided into a plurality of sub blocks SB0 to SBi (i: natural number) by sense amplifier bands SAB. Each sub block is divided into a plurality of sub memory arrays SMA by sub word driver bands SWB. In each of the sub memory arrays SMA, a plurality of memory cells are arranged in a matrix.

The memory array 40 also has a row/column control unit 42 for selecting an address according to the internal address INADD from addresses of the plurality of memory cells arranged by being divided into sub blocks and sub memory arrays. The row/column control unit 42 selectively activates a main word line MWL for selecting a row in the memory cells and a column selection line CSL for selecting a column in the memory cells.

The main word lines MWL are arranged so as to be shared by the plurality of sub memory arrays SMA constructing the same sub block every plural memory cell rows. A row in each sub memory array SMA is selected by the sub word line which will be described in detail hereinlater. The column selection line CSL selects a column in each sub memory array SMA. A pair of internal data buses are disposed so as to be shared by the sub blocks SB0 to SBi every (k) memory cell columns (k: natural number which is at least two). By performing k:1 column selection by the column selection line CSL, in each sub memory array SMA, selective coupling between a pair of bit lines (not shown) arranged in correspondence with each memory cell column and an internal write data bus pair IWBP, and an internal read data bus pair IRBP is controlled. Data to be written/read to/from the memory array 40 is transmitted via the internal write data bus pair IWBP and the internal read data bus pair IRBP, respectively, as independent pairs of data lines.

Figure 3:
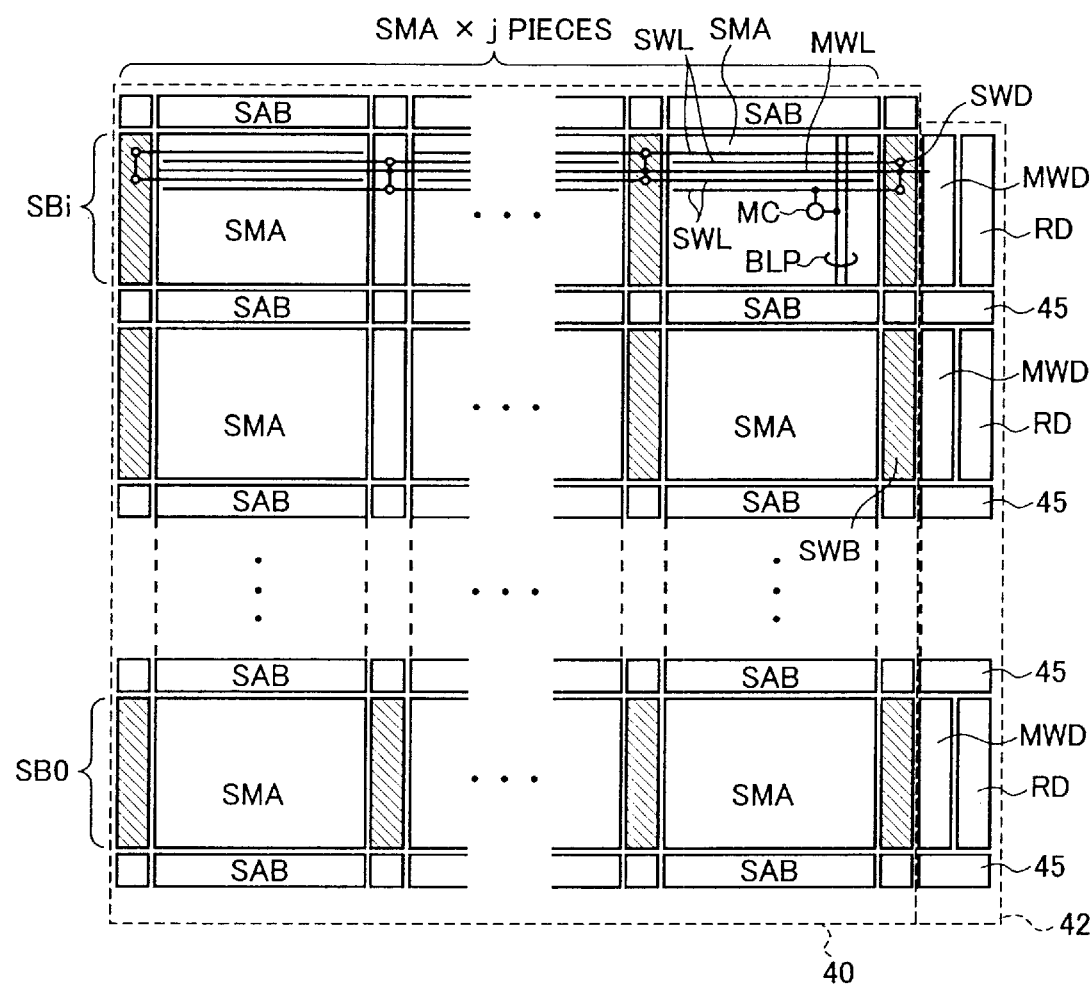
FIG. 3 is a block diagram for specifically explaining the configuration of a memory array.

FIG 3 is a block diagram for specifically explaining the configuration of the memory array 40.

Referring to FIG. 3, the memory array 40 is divided into the plurality of sub blocks SB0 to SBi by sense amplifier bands SAB in which not-illustrated sense amplifiers are to be disposed. Each of the sub blocks SB0 to SBi is divided into (j) sub memory arrays SMA (j: natural number which is two or larger) by sub word driver bands SWB. As already described, each of the sub memory arrays SMA has a plurality of memory cells arranged in a matrix.

In each of the sub memory arrays SMA, a sub word line SWL is disposed every memory cell row, and the bit line pair BLP is provided every memory cell column. In FIG. 3, the arrangement of the sub word lines SWL and the bit line pair BLP for a memory cell MC is representatively shown.

The row/column control unit 42 includes: a row decoder RD for decoding a row predecoded signal from the row predecoder 30; a main word driver MWD for controlling activation of the main word lines MWL in response to the result of the decoding of the row decoder RD; and a row local control unit 45 for generating a sub decoding signal (not shown) for selecting one of the plurality of sub word lines SWL, which is made correspond to one main word line MWL in response to the decoding result and a plurality of control signals for activating a sense amplifier. In the sub word driver band SWB, sub word drivers SWB are disposed in correspondence with the sub word lines SWL. The sub word driver SWD controls the activation of the sub word line SWL in accordance with the corresponding main word line MWL and a sub decoding signal generated by the row local control unit 45.

In each of the sub memory arrays SMA, for example, 512 sub word lines SWL are arranged. One of the sub word lines SWL is selected by the lower nine bits RA<8:0> in a row address. Each of the sub blocks SB0 to SBi is selected by the upper bits in the row address. For example, when i=15, one of the sub blocks SB0 to SBi is selected by four-bit RA<12:9>. In such a manner, a row in the memory array 40 is selected by selecting one of the sub blocks SB0 to SBi and the sub word line SWL according to the row address.

By column selection, for example, 16-bit data is selected in each of the sub memory array SMA. The data bit width of the DRAM core is therefore given by (16×j) bits.

Referring again to FIG. 2, the DRAM core MCR has: a data path band 50 for amplifying data read from the memory array 40 via the internal read data bus pair IRBP and driving data to be written into the memory array 40 via the internal write data bus pair IWBP; a data input/output control circuit 55 for receiving/transmitting the data read/written by the data path band 50 from/to the outside of the DRAM core MCR; and an internal voltage generating and refresh timer circuit 60. The data input/output control circuit 55 operates in response to an internal operation control signal generated by the main control circuit 10 and receives/transmits the read data RD/write data INDin synchronously with the operation clock signal DCLK.

For example, when the main control circuit 10 generates the row active command ACT, the row address input buffer and refresh counter 20 takes in the internal address INADD from the selector 5 as a row address and latches it. The row predecoder 30 generates a predecoded signal of the address latched in the row address input buffer and refresh counter 20. The main control circuit 10 further generates various internal operation control signals for rows to drive a word line and a sense amplifier.

When the main control circuit 10 generates the write command WRITE or read command READ, the column address input buffer 25 takes in the internal address INADD as a column address and latches it. The column predecoder 35 generates a predecoded signal of the address latched by the column address input buffer 25. The main control circuit 10 further generates the column selection signal and various internal operation control signals for columns to drive a preamplifier/write driver (not shown) in the data path band 50 and the data input/output control circuit 55.

When the main control circuit 10 receives the auto refresh command REFA or self refresh command REFS, a refresh counter operates in the row address input buffer and refresh counter 20 and a row address to be refreshed is generated on the inside. Particularly, when a self refresh mode is set, the self refresh timer operates in the internal voltage generation and refresh timer circuit 60, and refresh request signals FAY are automatically generated so that all of memory cell rows are refreshed in the maximum refresh time.

The configuration of the upper test interface circuit TICU according to the first embodiment will now be described with reference to FIG. 4.

In the first embodiment, the configuration of the test interface circuit corresponding to a case where a plurality of DRAM cores mounted on the semiconductor integrated circuit device 100 have different memory capacities and different data bit widths but the same column latency CL and the same operation frequency.

Figure 4:
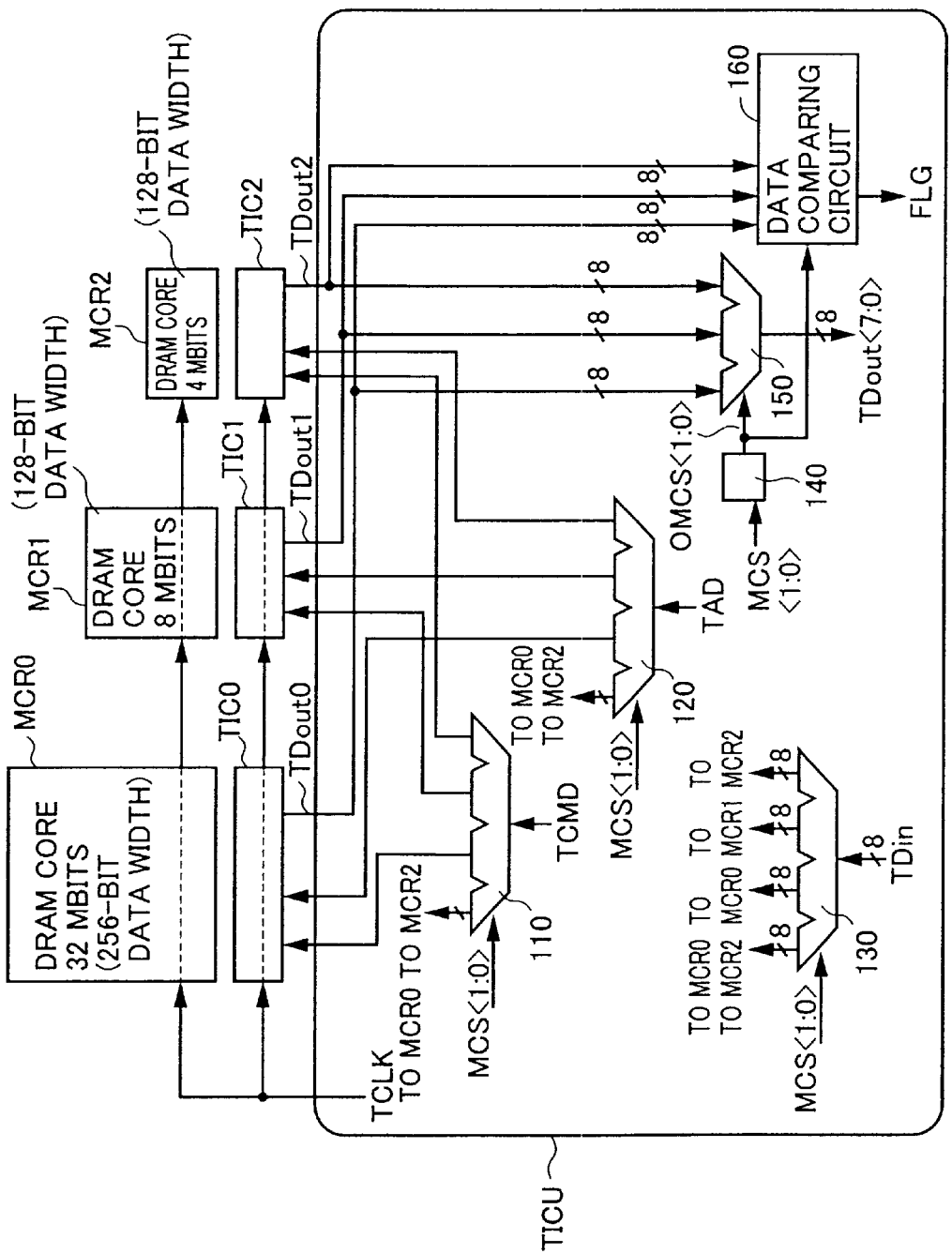
FIG. 4 is a block diagram showing the configuration of an upper test interface circuit TICU according to the first embodiment of the invention.

In FIG. 4, an operation test conducted on three DRAM cores MCR0 to MCR2 will be described. It is assumed that each of the sub memory arrays SMA shown in FIG. 3 has the same memory capacity of 128 K (512 rows×256 columns) and has the same number of sub word lines disposed.

Assuming now that the DRAM core MCR0 in FIG. 4 has 16 sub blocks, and each sub block is constructed by 16 sub memory arrays SMA. The memory capacity of the DRAM core MCR0 is therefore 32 Mbits and the data bit width is 256 bits.

It is assumed that the DRAM core MCR1 has eight sub blocks, and each sub block is constructed by eight sub memory arrays SMA. Consequently, the DRAM core MCR1 is a DRAM core having the memory capacity of 8 Mbits and the data bit width of 128 bits. The DRAM core MCR2 has four sub blocks and each sub block is constructed by eight sub memory arrays SMA. The DRAM core MCR2 is therefore a DRAM core having the memory capacity of 4 Mbits and the data bit width of 128 bits.

The DRAM cores MCR0 to MCR2 have the same operation frequency and the same column latency CL. Only the memory capacities and data bit widths of the DRAM cores MCR0 to MCR2 are different from each other.

The configuration of each of the test interface circuits TIC0 to TIC2 provided in correspondence with the DRAM cores MCR0 to MCR2 is substantially the same as that of the test interface circuit TIC illustrated in FIG. 17 except for the following point. In the test interface circuit TIC0, read data selection of 256:8 is performed by the read data selection circuit 4. On the other hand, in each of the test interface circuits TIC1 and TIC2, data selection of 128:8 is executed by the read data selection circuit 4.

Although not shown in FIG. 4, the selector 5 and the gate circuits 6 and 7 as test peripheral circuits are disposed in correspondence with each of the DRAM cores in a manner similar to the case of FIG. 17.

A test address TAD<12:0> of 13 bits is supplied to each of the test interface circuits TIC0 to TIC2. In the DRAM core MC0 having the largest memory capacity, a sub block is selected in accordance with the upper four bits RA<12:9> of the row address. At the time of generation of the row active command ACT, all of the bits in the test address TAD<12:0> are transmitted as a row address to the DRAM core MCR0. As described above, it is sufficient to determine the number of bits of the test address TAD so as to be adapted to the memory core having the largest memory capacity.

In the DRAM core MCR1, a sub block is selected from the eight sub blocks in accordance with the upper three bits RA<11:9> in the row address. Consequently, the uppermost address bit TAD<12> in the test address TAD<12:0> is latched into the latch/command decoder 1 in the test interface circuit TIC1 for a row active period. The lower 12 bits RA<11:0> are transmitted as a row address to the DRAM core MCR1.

In the case where the test control signal TCMD to be decoded to the write command WRITE for instructing writing of data is supplied to the DRAM core MCR1, when the address bit TAD<12> latched in the latch/command decoder 1 is "1", the write command WRITE is converted to a no-operation command NOP and the no-operation command NOP is transmitted to the DRAM core MCR1. In the case where the test control signal TCMD to be decoded into the read command READ for instructing reading of data is supplied, the read command READ is issued as it is to the DRAM core MCR1. It is sufficient to execute such a control by the latch/command decoder 1 in the test interface circuit TIC1.

In the DRAM core MCR2, a sub block is selected from the four sub blocks in accordance with the upper two bits RA<10:9> of the row address. Consequently, the thirteenth and twelfth upper bits TAD<12:11> in the test address TAD<12:0> are latched into the latch/command decoder 1 during the row active period, and the lower 11 bits RA<10:0> are transmitted as a row address to the DRAM core MCR2. In the case where the test control signal TCMD to be decoded to the write command WRITE is supplied, when the latched test address TAD<12:11> of two bits is described as TAD<12> and TAD<11> and TAD<12:11>=(1, 1), (1, 0), or (0, 1), the latch/command decoder 1 included in the test interface circuit TIC2 converts the write command WRITE to the no-operation command NOP, and outputs the no-operation command NOP to the DRAM core MCR2. On the other hand, when the test control signal TCMD to be decoded to the read command READ is supplied, the latch/command decoder 1 transmits the read command READ as it is to the DRAM core MCR2. It is sufficient to execute such a control by the latch/command decoder 1 in the test interface circuit TIC2.

As described above, the number of bits of the test address TAD<12:0> is set according to the largest memory capacity in the plurality of DRAM cores (MCR0 in the example of FIG. 4). Further, by performing selection using a part of the bits in the test address in the other DRAM cores, the test address TAD<12:0> can be shared by the DRAM cores of different memory capacities.

The time required for an operation test on each of the DRAM cores depends on the memory capacity. For instance, in the example of FIG. 4, an operation test is simultaneously conducted on the DRAM cores MCR0 to MCR2 having different memory capacities by the upper test interface circuit TICU, the operation test is completed in accordance with the order of MCR2 (4 Mbits), MCR1 (8 Mbits), and MCR0 (32 Mbits).

As already described, in the DRAM cores (MCR1 and MCR2) other than the DRAM core (MCR0) having the largest memory capacity, by converting the write command WRITE to the no-operation command NOP in accordance with the bits except for a part of the bits used for selecting a self address out of test addresses shared by the DRAM cores, the operation test on the DRAM core on which the operation test has been finished can be stopped.

On the other hand, when the operation test is conducted without such conversion to the no-operation command NOP, until the operation test on the DRAM core having the largest memory capacity is completed, in the other DRAM cores, even after a predetermined operation test is once completed, a similar operation test is repeated.

Until the operation test on the MCR0 requiring the longest time for the operation test, that is, having the largest memory capacity is completed, the operation test is repeatedly executed in each of the memory cores MCR2 and MCR1 each requiring relatively short time for the operation test, that is, having a small memory capacity, thereby enabling the plurality of DRAM cores MCR0 to MCR2 to be operated in parallel through the operation test period.

As a result, on the DRAM core MCR0 having the largest memory capacity as well, the operation test of which mutual interference with the other DRAM core with respect to all of the bits has been evaluated can be conducted. That is, the operation test in the semiconductor integrated circuit device 100 can be executed with high accuracy under conditions closer to actual operation.

The upper test interface circuit TICU controls the supply of the test control signal TCMD and the test address TAD to the test interface circuits TIC0 to TIC2 provided in correspondence with the DRAM cores MCR0 to MCR2, respectively, and the input and output of the test input data TDin and the test output data TDout.

The upper test interface circuit TICU transmits the test control signal TCMD, test address TAD, and test input data TDin received by the test pin terminal group TPG to the interface circuit corresponding to the DRAM core targeted for the operation test in accordance with the memory core selection signal MCS for selecting the DRAM core to be tested. The upper test interface circuit TICU processes test output data TDout0 to TDout2 from each of the test interface circuits TIC0 to TIC2 in accordance with the memory core selection signal MCS and outputs resultant data from the test pin terminal group TPG.

In FIG. 4, a memory core selection signal MCS<1:0> of two bits is used to determine the target of the operation test from the three DRAM cores MCR0 to MCR2. It is sufficient to supply the memory core selection signal MCS<1:0> from an external memory tester or the like via the test pin terminal group TPG in a manner similar to the test control signal TCMD or the like.

When the signal levels of the bits of the memory core selection signal MCS<1:0> are described as MCS<1>, MCS<0> and one of the DRAM cores MCR0 to MCR2 is desired to be independently targeted for the operation test, the memory core selection signal MCS<1:0> is set to (0, 1), (1, 0) or (1, 1). On the other hand, when it is desired to simultaneously target the DRAM cores MCR0 to MCR2 for the operation test, the memory core selection signal MCS<1, 0> is set to (0, 0).

The upper test interface circuit TICU includes selectors 110, 120, and 130 which operate in accordance with the memory core selection signal MCS<1:0>. The selector 110 transmits the test control signal TCMD supplied from the test pin terminal group TPG to one of or each of the DRAM cores MCR0 to MCR2 in accordance with the memory core selection signal MCS<1:0>. Similarly, the selector 120 transmits the test address TAD<12:0> to one of or each of the DRAM cores MCR0 to MCR2 in accordance with the memory core selection signal MCS<1:0>. The selector 130 transmits the test input data TDin of eight bits to one of or each of the DRAM cores MCR0 to MCR2 in accordance with the memory core selection signal MCS<1:0>.

In the case where the memory core selection signal MCS<1:0>=(0, 1), therefore, the test control signal TCMD, test address TAD<12:0> and test input data TDin are transmitted only to the DRAM core MCR0 via the test interface circuit TIC0. When the memory core selection signal MCS<1:0>=(1, 0), the test control signal TCMD, test address TAD<12:0>, and test input data TDin are transmitted only to the DRAM core MCR1 via the test interface circuit TIC1. Similarly, when the memory core selection signal MCS<1, 0>=(1, 1), the test control signal TCMD, test address TAD<12:0>, and test input data TDin are transmitted only to the DRAM core MCR2 via the test interface circuit TIC2.

On the other hand, in the case where the memory selection signal MCS<1,0>=(0, 0), the test control signal TCMD, test address TAD, and test input data TDin are transmitted to each of the DRAM cores MCR0 to MCR2 via the test interface circuits TIC0 to TIC2, respectively.

The upper test interface circuit TICU further includes a shifting circuit 140 for shifting the memory core selection signal MCS<1:0> only by the predetermined number of clock cycles of the test clock signal TCLK. The shifting circuit 140 transmits OMCS<1:0> to a selector 150 and a data comparing circuit 160. The signal OMCS<1:0> is obtained by shifting the memory core selection signal MCS<1:0> only by the required number of clock cycles of the test clock signal TCLK required for a period of time from reception of the test control signal TCMD and the test address TAD until transmission of test output data TDout from the DRAM core to the upper test interface circuit TICU.

The upper test interface circuit TICU further includes: the selector 150 for selectively outputting, as eight-bit test output data TDout<7:0>, one of the eight-bit test output data TDout0 to TDout2 corresponding to the DRAM cores MCR0 to MCR2, respectively, in accordance with the memory core selection signal OMCS<1:0> from the shifting circuit 140; and the data comparing circuit 160 which operates in response to the memory core selection signal OMCS<1:0> from the shifting circuit 140.

The selector 150 can receive the test output data TDout0 to TDout2 corresponding to the DRAM cores MCR0 to MCR2, respectively, outputted from the test interface circuits TIC0 to TIC2. When the memory core selection signal OMCS<1:0>=(0,1), the selector 150 outputs the test output data TDout0 from the DRAM core MCR0 transmitted from the test interface circuit TIC0 as the test output data TDout<7:0> from the test pin terminal group TPG. When the memory core selection signal OMCS<1:0>=(1,0), the selector 150 outputs the test output data TDout1 from the DRAM core MCR1 transmitted via the test interface circuit TIC1 as the test output data TDout<7:0> from the test pin terminal group TPG. When the memory core selection signal OMCS<1:0>=(1,1), the selector 150 outputs the test output data TDout2 from the DRAM core MCR2 transmitted via the test interface circuit TIC2 as the test output data TDout<7:0> from the test pin terminal group TPG.

When the memory core selection signal OMCS<1:0>=(0, 0), that is, when all of the DRAM cores are targeted for the operation test, the selector 150 stops outputting the test output data TDout<7:0>.

The data comparing circuit 160 operates only when the memory core selection signal OMCS<1:0>=(0,0) so as to be complementary to the selector 150 and compares the data levels in the bits of the test output data TDout0 to TDout2 transmitted from the test interface circuits TIC0 to TIC2, respectively. The data comparing circuit 160 outputs judging flag data FLG on the basis of the result of the comparison of the data levels in each of the bits in the test output data TDout0 to TDout2. For example, when the data levels of test output data from the DRAM cores coincide with each other in all of the bits of the test output data TDout0 to TDout2, the judging flag data FLG is "1".

When any one of the DRAM cores is targeted for the operation test, therefore, the upper test interface circuit TICU outputs the test output data from the DRAM core selected as the target of the test operation as the test output data TDout<7:0> from the test pin terminal group TPG. When all of the DRAM cores are targeted for the operation test, the judging flag data FLG obtained by data compression by the comparison between the test output data from the DRAM cores is outputted. Consequently, also in the case where a plurality of DRAM cores are simultaneously targeted for the operation test, the result of the operation test can be efficiently derived on the outside with the small number of pin terminals.

When it is unnecessary to dynamically switch the DRAM cores as targets of the operation test, the memory core selection signal MCS<1:0> may be maintained at a constant value until the operation test of a predetermined interval is completed. In this case, the selector 150 and the w data comparing circuit 160 can be directly controlled by the memory core selection signal MCS<1:0> without disposing the shifting circuit 140. With such a configuration as well, for example, when a defect is detected by the judge flag data FLG after execution of the operation test targeted on all the DRAM cores, the operation shifts to an operation test targeted on each of the DRAM cores. In such a manner, the operation test can be efficiently conducted.

The operation of writing data to each of the DRAM cores MCR0 to MCR2 in the case of conducting the operation test simultaneously on the DRAM cores will now be described. In this case, it is necessary to consider that the memory capacities of the DRAM cores are different from each other.

Figure 5:
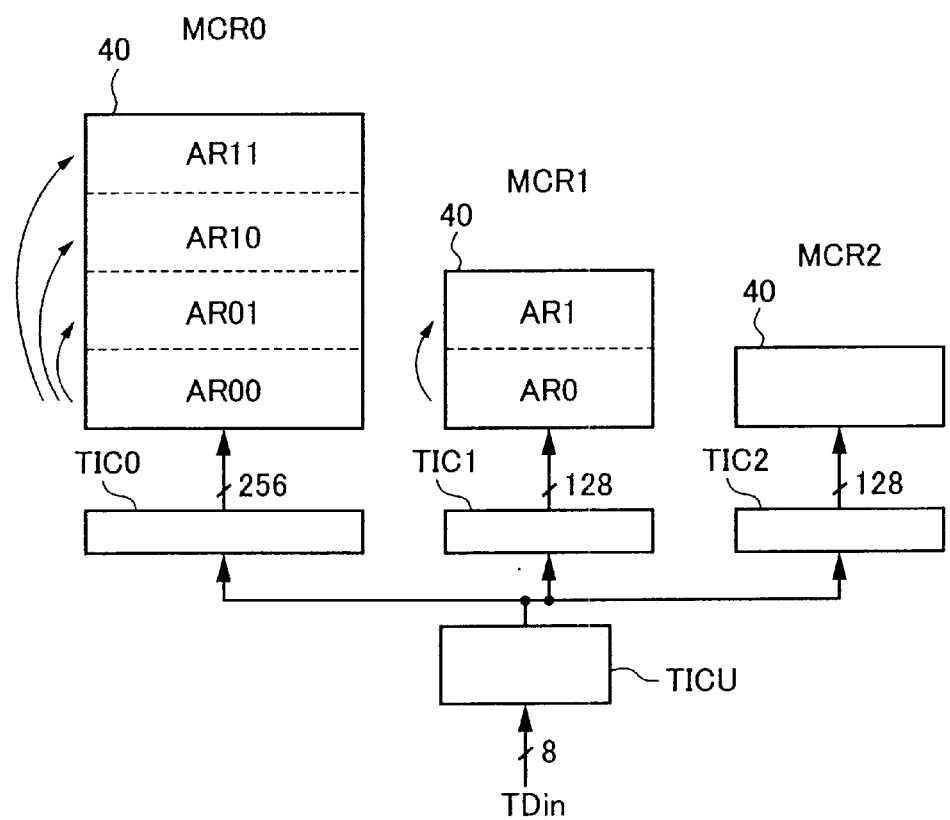
FIG. 5 is a conceptual diagram for explaining an operation of writing data to each of DRAM cores MCR0 to MCR2 in the case of conducting an operation test simultaneously on the DRAM cores.

FIG. 5 shows the operation of writing data to each of the DRAM cores MCR0 to MCR2 in the case of conducting the operation test simultaneously on the DRAM cores.

Referring to FIG. 5, among the DRAM cores MCR0 to MCR2, the DRAM core MCR2 has the smallest number of sub blocks (that is, the number of memory cell rows). The DRAM core MCR0 has sub blocks (that is, memory cell rows) four times as many as that of the DRAM core MCR2, and the DRAM core MCR1 has sub blocks twice as many as that of the DRAM cores MCR2.

In the DRAM core MCR0, the memory array 40 is divided into areas AR00 to AR11 corresponding to row address spaces of the upper bits RA<12:11> of the row address=(0, 0), (0, 1), (1, 0), and (1, 1), respectively. Each of the areas AR00 to AR11 have the same number of memory cell rows. In the case of conducting the operation test simultaneously on the DRAM cores MCR0 to MCR2, the test input data TDin supplied via the upper test interface circuit TICU and the test interface circuit TIC0 is repeatedly written into each of the areas AR00 to AR11.

Simultaneously, in the DRAM core MCR1, the memory array 40 is divided into the areas AR0 and AR1 corresponding to the row address spaces of (0) and (1) of the row address RA<11>. Each of the areas AR0 and AR1 have the same number of memory cell rows. In the case of conducting the operation test simultaneously on the DRAM cores MCR0 to MCR2, the test input data TDin supplied via the upper test interface circuit TICU and the test interface circuit TIC1 is repeatedly written to each of the areas AR0 and AR1.

In the DRAM core MCR2, the number of memory cell rows included in the memory array 40 is equal to that of each of the areas AR0, AR1, and AR00 to AR11 divided in the DRAM cores MCR0 and MCR1. Consequently, it is unnecessary to repeatedly write the test input data TDin.

As described above, in the case of simultaneously writing test data for the operation test to the plurality of DRAM cores of different memory capacities, by reflecting a difference in the number of sub blocks, that is, the number of memory cell rows, in the other DRAM cores each having the memory capacity of sub blocks (memory cell rows) of K times (K: natural number) as many as that of the DRAM core having the smallest number of sub blocks (smallest number of memory cell rows), the memory array 40 is divided into (K) areas (row address spaces) having the same number of memory cell rows, and the same test input data TDin is repeatedly written into each of the areas. That is, in the DRAM cores MCR0, MCR1 and MCR2, K=4, K=2, and K=1, respectively.

The read data selection signal RD_S for controlling the selection of read data in the test interface circuits TIC0 to TIC2 has to be generated in consideration of variations in data bit width in the DRAM cores.

Figure 6:
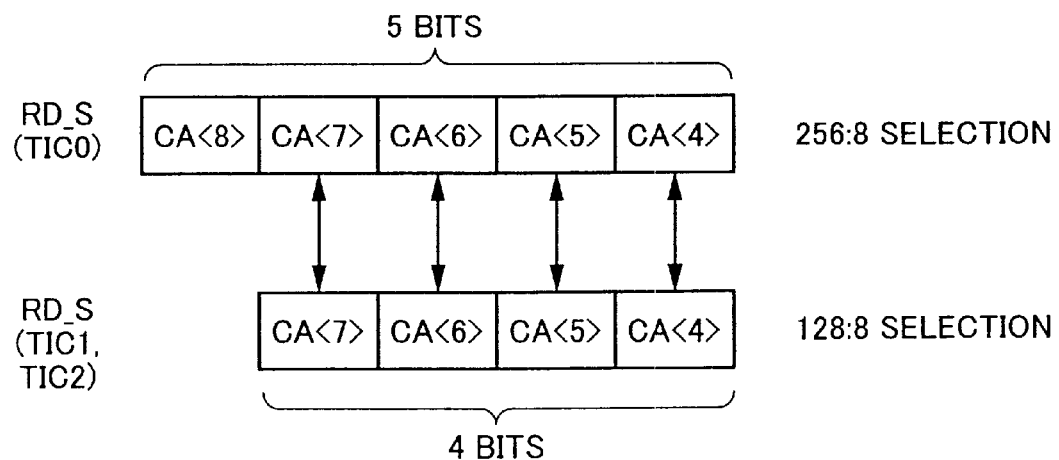
FIG. 6 is a conceptual diagram for explaining setting of a read data selection signal in the case of conducting an operation test simultaneously on the DRAM cores MCR0 to MCR2.

FIG. 6 shows setting of the read data selection signal in the case of conducting the operation test simultaneously on the DRAM cores MCR0, MCR1, and MCR2.

Referring to FIG. 6, it is necessary to perform selection of 256:8 of test output data by using the read data selection signal RD_S of five bits in the test interface circuit TIC0 corresponding to the DRAM core MCR0. On the other hand, in the test interface circuits TIC1 and TIC2 corresponding to the DRAM cores MCR1 and MCR2, respectively, it is necessary to execute the read data selection of 128:8 by the read data selection signal RD_S of four bits.

The read data selection signal RD_S is generated in the test interface circuit TIC0 by using, for example, upper five bits CA<8:4> in a column address CA<8:0> of nine bits. In this case, the read data selection signal RD_S in each of the test interface circuits TIC1 and TIC2 is constructed by using upper bits CA<7:4> in the column address. That is, in the test interface circuits TIC1 and TIC2 which select read data in correspondence with the DRAM cores MCR1 and MCR2 each having a data bit width of 128 bits, the read data selection signal RD_S of four bits is constructed so as to coincide with the lower four bits of the read data selection signal RD_S of five bits used in the test interface circuit TIC0. Consequently, a plurality of DRAMs having different data bit widths can share the column address.

Therefore, a row address and a column address can be commonly used by a plurality of DRAM cores having different memory capacities and different data bit widths, and an operation test can be simultaneously conducted on the DRAM cores.

Figure 7:
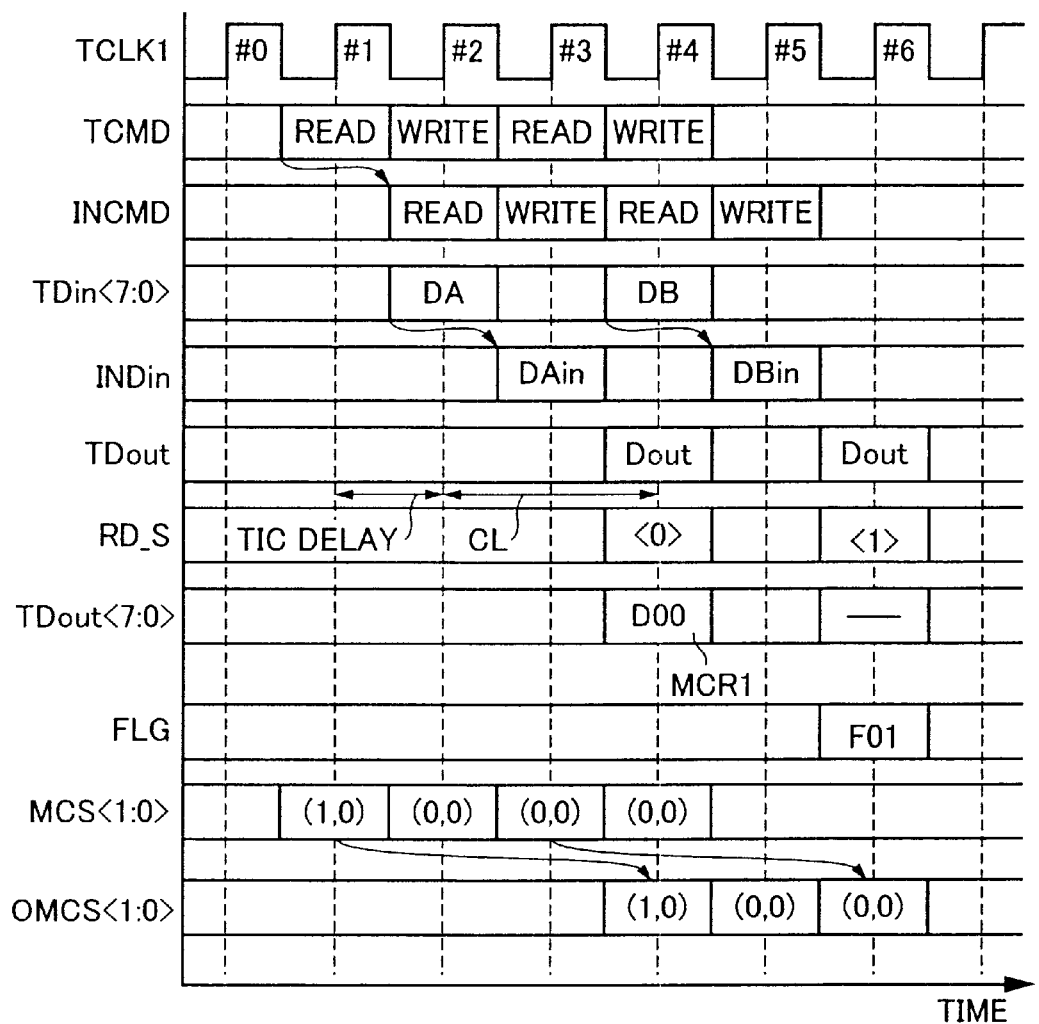
FIG. 7 is a timing chart for explaining the operations of the test interface circuit according to the first embodiment.
Figure 19:
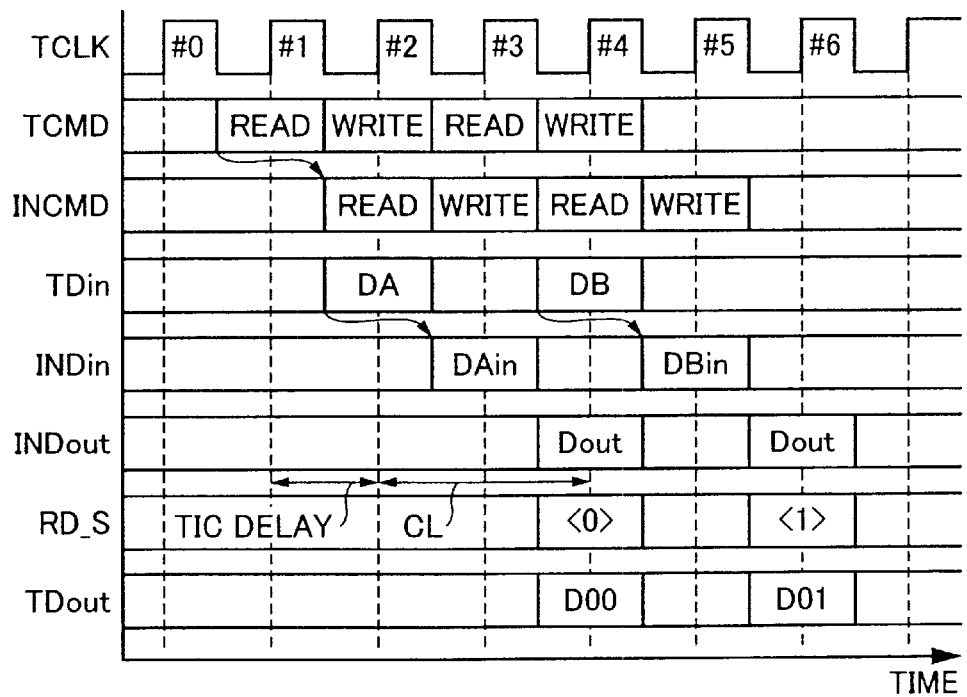
FIG. 19 is a timing chart for explaining the operations of a test interface circuit illustrated in FIG. 17.

Referring to FIG. 7, the inputting of a test control signal TCMD similar to that shown in FIG. 19 is executed in each of clock cycles #1 to #4 of the test clock signal TCLK. In the clock cycles, a memory core selection signal MCS<1:0> for designating the DRAM core targeted for an operation test is also inputted.

In clock cycle #1, since the memory core selection signal MCS<1:0> to be inputted is (1, 0), in response to the read command READ inputted in clock cycle #1, the internal command INCMD indicative of the read command READ to the DRAM core MCR1 is generated in dock cycle #2. In response to this, in clock cycle #4 after elapse of two clock cycles corresponding to the column latency CL, read data Dout from the DRAM core MCR1 is outputted. In the test interface circuit TIC1, at this timing, the read data selection signal RD_S<0> is supplied to the read data selection circuit 4. Consequently, the test interface circuit TIC1 outputs test output data TDout(D00).

Similarly, in clock cycle #4, the memory core selection signal OMCS<1:0> obtained by the shift of the shifting circuit 140 is transmitted to the selector 150 and the data comparing circuit 160. In dock cycle #4, therefore, the selector 150 outputs the test output data (D00) from the DRAM core MCR1 as the test output data TDout<7:0> to the outside via the test pin terminal group TPG. As described above, in the first embodiment, it is sufficient to set the shift amount in the shifting circuit 140 in accordance with the sum between the column latency CL of each of the DRAM cores and a delay (TIC delay) which occurs in the test interface circuit.

In clock cycle #2, the memory core selection signal MCS<1:0> is set to (0, 0). In response to the write command WRITE given by the test control signal TCMD inputted in clock cycle #2, the internal command INCMD indicative of the write command WRITE is generated to each of the DRAM cores MCR0 to MCR2. In accordance with the internal command INCMD, the write data INDin(DAin) corresponding to the test input data TDin<7:0> (DA) is written to each of the DRAM cores MCR0 to MCR2.

Subsequently, in clock cycle #3, the memory core selection signal MCS<1:0> is set to (0, 0), and the test control signal TCMD indicative of the read command READ is given. In response to the read command READ, in clock cycle #4, in each of the DRAM cores MCR0 to MCR2, the internal command INCMD indicative of the read command READ is generated. In response to the read command READ, in clock cycle #6 after elapse of two clock cycles corresponding to the column latency CL, read data is outputted from each of the DRAM cores MCR0 to MCR2. In the test interface circuits TIC0 to TIC2 corresponding to the DRAM cores MCR0 to MCR2, the read data selection signal RD_S(<1>) is generated, and test output data TDout<7:0> (D01) of eight bits is outputted from each of the test interface circuits.

In clock cycle #6, since the memory core selection signal OMCS<1:0> outputted from the shifting circuit 140 is set to (0,0), the selector 150 does not operate. On the other hand, the data comparing circuit 160 enters an operating state and outputs a determination result obtained by compressing the test output data TDout0 to TDout2 outputted from the DRAM cores. Specifically, the data levels of the test output data from the DRAM cores are compared with each other in each of the bits of the test output data TDout0 to TDout2. The result of the comparison is outputted as the judging flag data FLG(F01) from the test pin terminal group TPG to an external memory tester or the like. Such a comparison can be made by providing an exclusive-OR gate in the data comparing circuit 160.

In clock cycle #4, the memory core selection signal MCS<1:0> is set to (0, 0), and the write command WRITE is supplied by the test control signal TCMD. Since the operation in response to the write command WRITE is similar to that in the case of the write command WRITE given in the clock cycle #2, its detailed description is not repeated here.

As described above, in the semiconductor integrated circuit device according to the first embodiment, an operation test on a plurality of DRAM cores having the same column latency CL and the same operation frequency but having different memory capacities and different data bit widths can be simultaneously conducted. By using the judging flag data FLG, the result of the operation test can be efficiently obtained on the outside with the small number of pin terminals.

Although FIG. 7 shows the example in which the DRAM cores targeted for the operation test are dynamically changed by the memory core selection signal MCS<1:0>, the operation test may be conducted by setting the memory core selection signal MCS<1:0> to a constant value during a period of a series of operations. As already described, in this case, the selector 140 may not be used in the test interface circuit.

Second Embodiment

In the second embodiment, a case where a plurality of DRAM cores mounted on the same semiconductor integrated circuit device have different column latencies CL will be described. In this case, the invention can be applied to the case where the DRAM cores have the same memory capacity and the same data bit width and the case where the DRAM cores have different memory capacities and different data bits widths as in the first embodiment. As an example, a case where the three DRAM cores MCR0 to MCR2 have memory capacities and data bit widths similar to those in the case of the first embodiment will be described.

Figure 8:
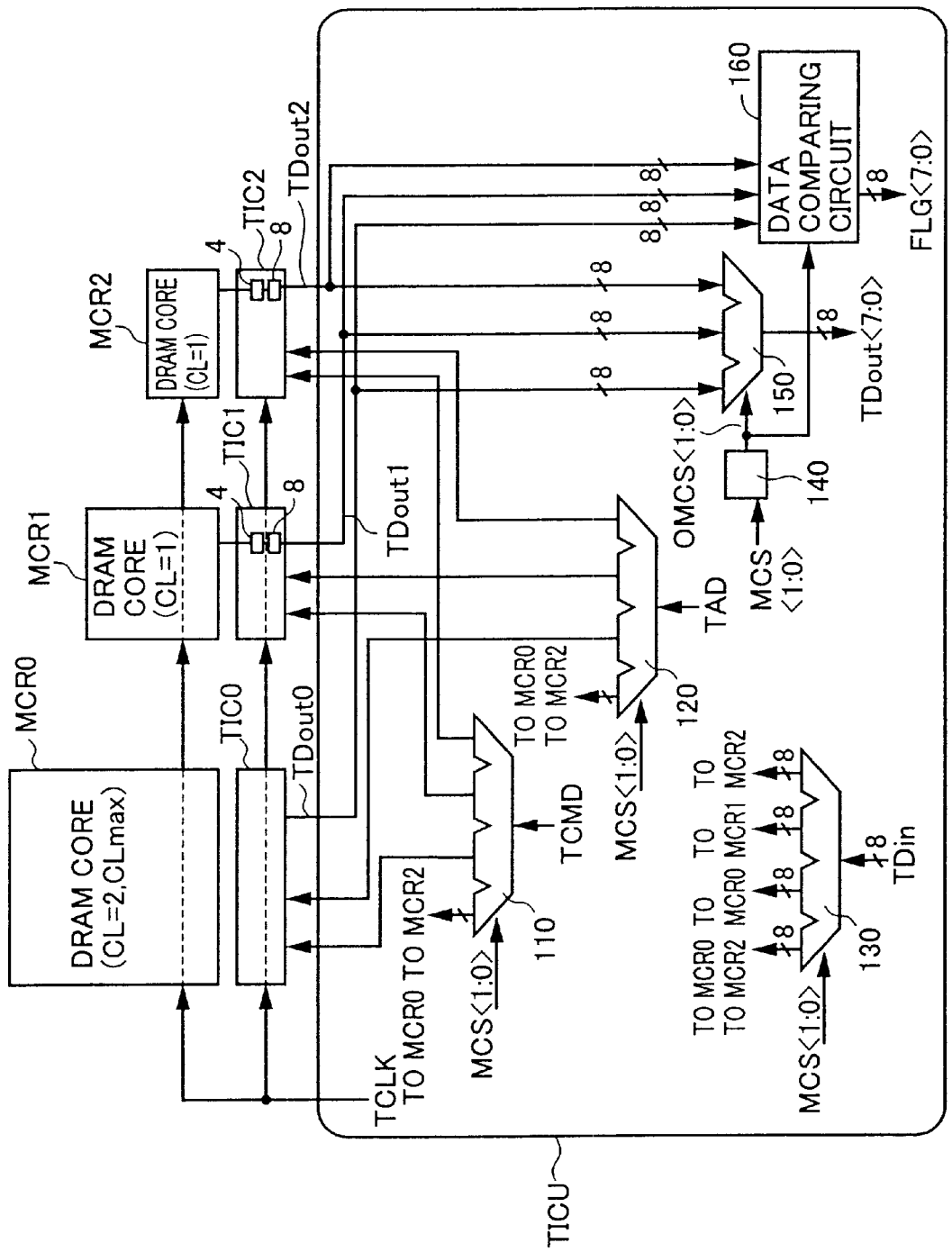
FIG. 8 is a block diagram showing the configuration of a portion related to the test interface circuit in a semiconductor integrated circuit device according to a second embodiment of the invention.

FIG. 8 shows the configuration of the portion related to the test interface circuit in the semiconductor integrated circuit device according to the second embodiment of the invention.

Referring to FIG. 8, the DRAM core MCR0 has CL of 2 and each of the DRAM cores MCR1 and MCR2 has CL of 1. The column latency difference ΔCL between each of the DRAM cores MCR1 and MCR2 and the DRAM core MCR0 is equal to "1" and corresponds to one clock cycle of the test clock signal TCLK.

In this case, as each of the test interface circuits TIC1 and TIC2 corresponding to the DRAM cores MCR1 and MCR2 each having a relatively small column latency, a test interface circuit TICa including a data shifting circuit 8 to deal with the column latency difference has to be provided. The configuration of the test interface circuit TIC shown in FIG. 17 can be applied to the test interface circuit TIC0 corresponding to the DRAM core MCR0 having the largest column latency in a manner similar to the first embodiment.

Figure 9:
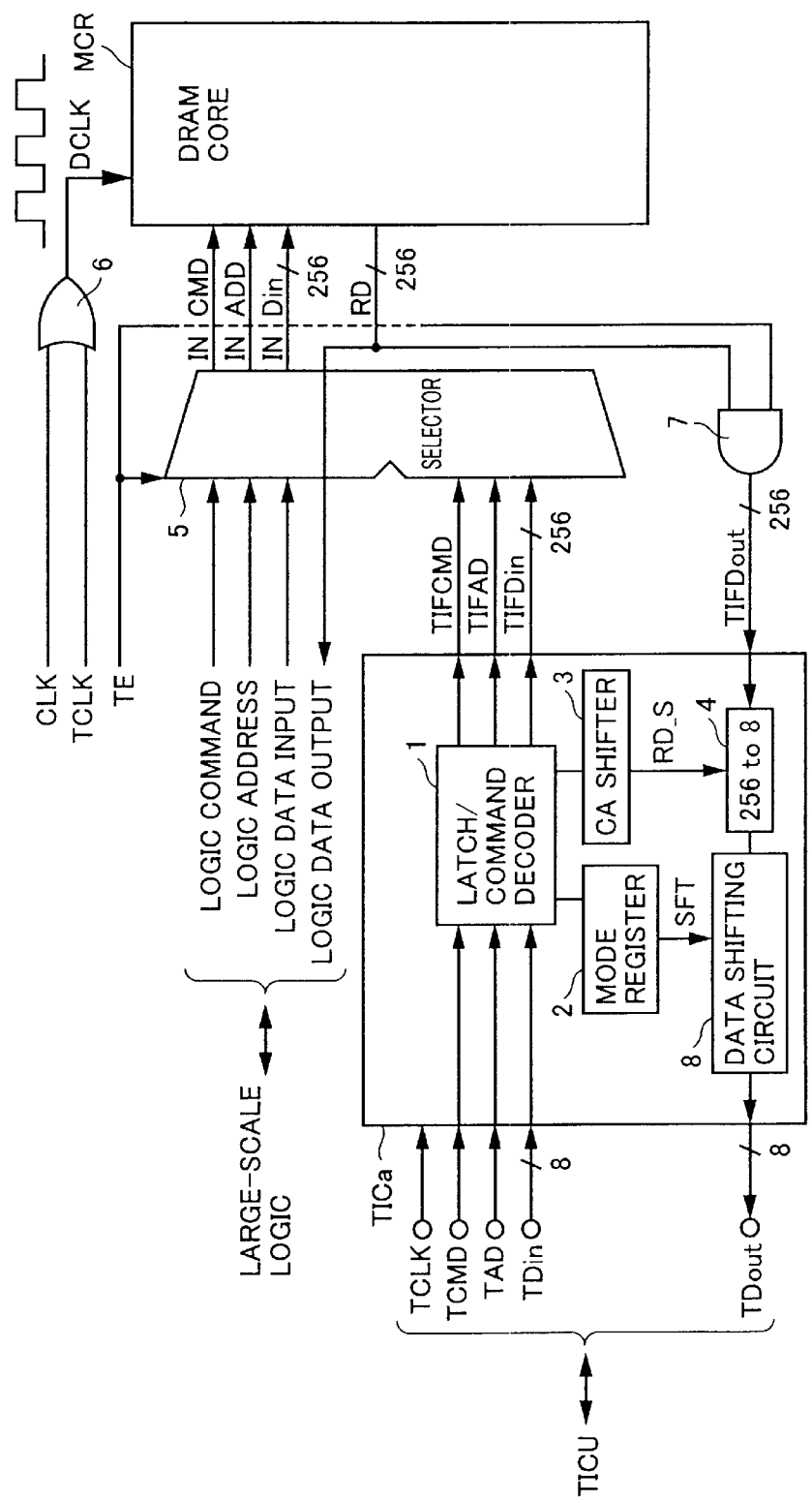
FIG. 9 is a circuit diagram showing the configuration of a test interface circuit TICa according to the second embodiment.

FIG. 9 is a circuit diagram showing the configuration of the test interface circuit TICa according to the second embodiment. The test interface circuit TICa shown in FIG. 9 can be applied as each of the test interface circuits TIC1 and TIC2 provided in correspondence with the DRAM cores MCR1 and MCR2 each having the relatively small column latency CL.

Referring to FIG. 9, the test interface circuit TICa is different from the test interface circuit TIC shown in FIG. 17 with respect to the point that the test interface circuit TICa further includes the data shifting circuit 8 for shifting the test output data output from the read data selection circuit 4 for a predetermined period and outputting resultant data to the upper test interface circuit TICU.

Figure 10:
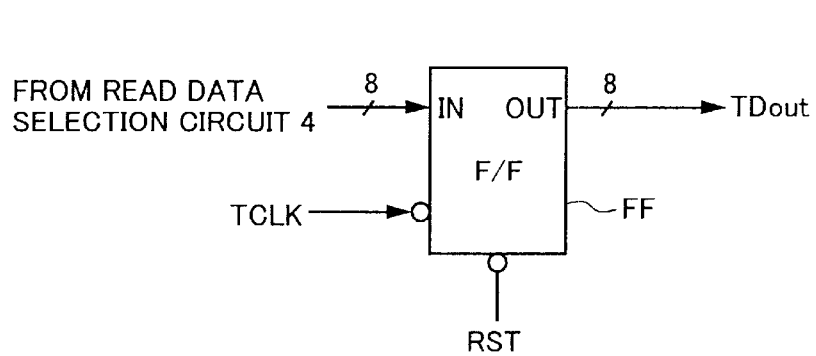
FIG. 10 is a block diagram showing the configuration of a data shifting circuit 8.

FIG. 10 is a block diagram showing the configuration of the data shifting circuit 8

Referring to FIG. 10, the data shifting circuit 8 shown in FIG. 10 includes a flip flop FF in correspondence with the fact that the column latency difference between each of the DRAM cores MCR1 and MCR2 and the DRAM core MCR0 is one clock cycle. The flip flop FF operates in response to the falling edge of the test clock signal TCLK and outputs, as test output data Tpout, 8-bit output data transmitted from the read data selection circuit 4 to the input node IN from the output node OUT. The flip flop FF further has a reset terminal. When a reset signal RST is activated to the L level, the output node OUT is reset to the L level.

Since the configuration and the operation of the upper test interface circuit TICU provided commonly for the test interface circuits TIC0, TIC1, and TIC2 are similar to those of the first embodiment, the detailed description is not repeated here.

Figure 11:
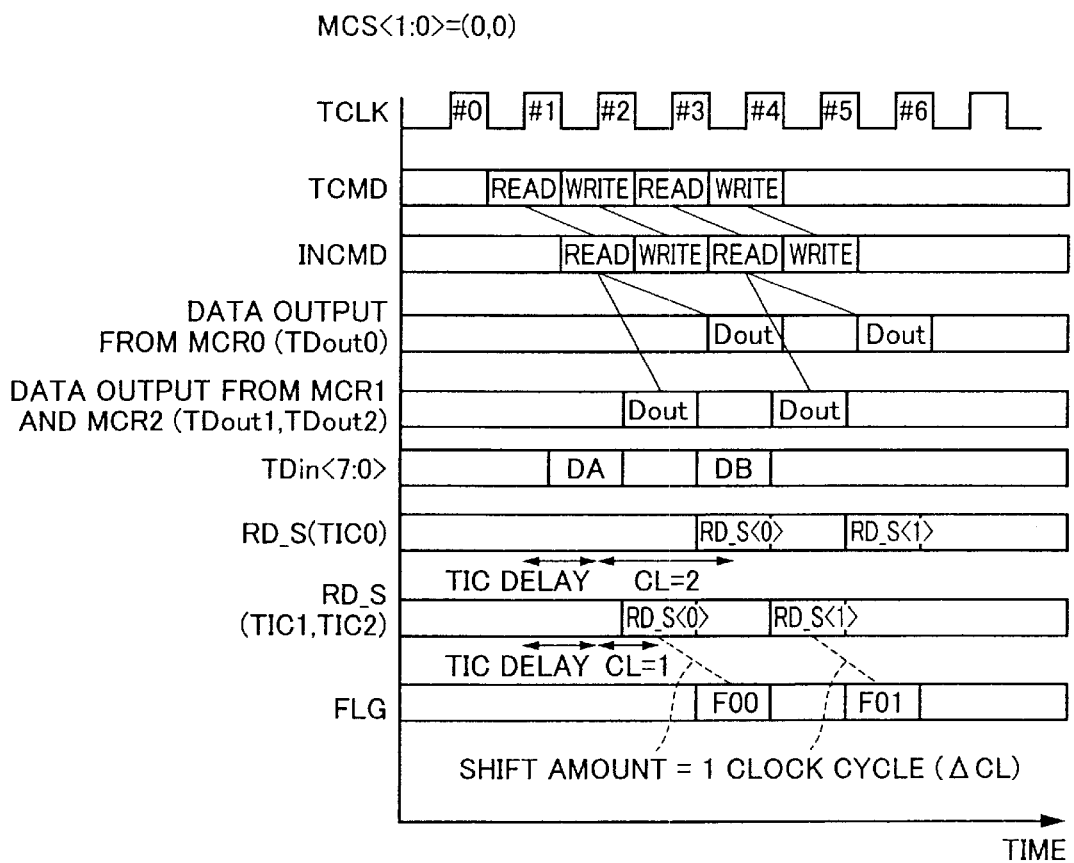
FIG. 11 is a timing chart for explaining the operation of the test interface circuit according to the second embodiment.

FIG. 11 is a timing chart for explaining operations of a test interface circuit according to the second embodiment.

FIG. 11 shows a case such that the memory core selection signal MCS<1:0> is set to (0, 0) and all of the DRAM cores MCR0, MCR1, and MCR2 are targeted for the operation test. As already described, on the precondition. that such an operation test is conducted, by not providing the selector 140, the configuration of the test interface circuit can be simplified.

Referring to FIG. 11, in clock cycle #1, the test control signal TCMD as the read command READ is supplied from a memory tester or the like on the outside. In response to the read command READ, in clock cycle #2, the internal command INCMD indicative of the read command READ is generated for each of the DRAM cores MCR0 to MCR2.

In the DRAM core MCR0 having the column latency CL of 2, in clock cycle #4 after elapse of two clock cycles from the clock cycle #2, output data from the DRAM core is transmitted to the corresponding test interface circuit TIC0. By generating the read data selection signal RD_S<0> in response to this, the test interface circuit TIC0 outputs the test output data TDout0 in the clock cycle #4.

On the other hand, in each of the DRAM cores MCR1 and MCR2 having the column latency CL of 1, in clock cycle #3 after elapse of one clock cycle, output data from the DRAM core is transmitted to the corresponding test interface circuits TIC1 and TIC2. In the same clock cycle #3, by generating the read data selection signal RD_S<0>, each of the test interface circuits TIC1 and TIC2 can determine the test output data TDout1 and TDout2.

Each of the test interface circuits TIC1 and TIC2 outputs the test output data in the clock cycle #4 after shifting the test output data by one clock cycle by the data shifting circuit 8.

As described above, in the test interface circuit corresponding to the DRAM core having a relatively small column latency CL, by shifting the test output data only by the number of clock cycles according to the column latency difference (ACL), the output timings of the test output data from the DRAM cores in the test interface circuits can be made coincide with each other.

As a result, the judging flag data FLG(F00) in which the result of the comparison in each of the bits of the test output data TDout0 to TDout2 outputted from the respective DRAM cores can be outputted in the clock cycle #4. Consequently, the operation test targeted for a plurality of memory cores having different column latencies can be conducted.

Since an operation performed in response to the write command WRITE given by the test control signal TCMD in the dock cycles #2 and #4 is similar to that described in FIG. 7, its description is not repeated here. With respect to the data inputting operation to all of the DRAM cores, when the DRAM cores have different memory capacities and different data bit widths, by setting the row address RA and the column address CA in a manner similar to the first embodiment, the test data can be written while commonly using the test address TAD. Since the operation performed in response to the read command READ which is given again in the dock cycle #3 is also similar to that performed in response to the read command READ inputted in the dock cycle #1, the detailed description is not repeated here.

Referring again to FIG. 9, by generating the shift amount setting signal SFT for controlling the shift amount in the data shifting circuit 8, that is, the number of clock cycles of the test dock signal TCLK in accordance with the column latency CL of the corresponding DRAM core stored in the mode register 2, the invention can also deal with the case where the column latency CL is variable.

Figure 12:
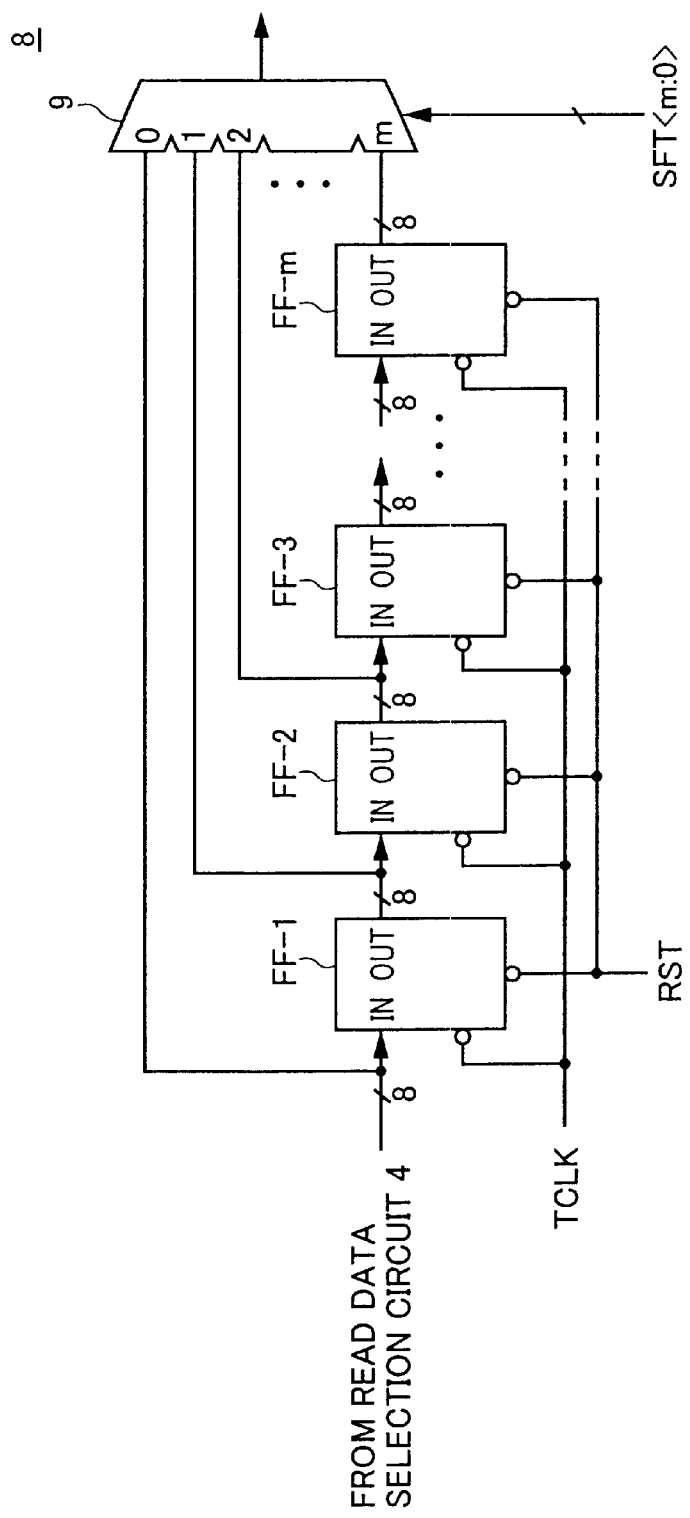
FIG. 12 is a block diagram showing the configuration of the data shifting circuit 8 capable of controlling a shift amount in response to a shift amount setting signal SFT.

With reference to FIG. 12, the configuration of the data shifting circuit 8 capable of controlling the shift amount in response to the shift amount setting signal SFT will now be described.

Referring to FIG. 12, the data shifting circuit 8 has m (m: natural number) flip flops FF-1 to FF-m which are coupled in series and a selector 9. Test output data of eight bits outputted from the read data selection circuit 4 is supplied to the input node IN of the flip-flop FF-0 at the first stage. Each of data outputted from the flip flops FF-1 to FF-m and data outputted from the read data selection circuit 4 is supplied to the selector 9.

The selector 9 selects one of the input data in accordance with a shift amount setting signal SFT<m:0> of (m+1) bits and outputs the selected data as test output data TDout. One bit in the shift amount setting signal SFT<m:0> is activated in accordance with the set shift amount (the number of clock cycles of the test clock signal TCLK). For example, when the shift amount is "0", one bit SFT<0> in the shift amount setting signal SFT<m:0> is activated to the H level and the other bits are made inactive to the L level. Similarly, when the shift amount is "m'" (m': integer from 0 to m), one bit SFT<m'> in the shift amount setting signal SFT<m:0> is activated to the H level, and each of the remaining bits is made inactive.

The setting of the shift amount will now be described. The longest column latency CL among the column latencies CL set for the plurality of DRAM cores mounted on the same semiconductor integrated circuit is defined as CLmax, in the test interface circuit corresponding to the n-th (n: integer from 0 to N) DRAM core of which column latency is set as CL(n), it is sufficient to set the column latency difference ACL(n) defined by the following equation (1) as a shift amount.

$$\Delta ACL(n) = CL\max - CL(n) \quad (1)$$

As described above, by setting the shift amount in the data shifting circuit 8 in accordance with the shift amount setting signal SFT<m:0>, even when the column latency CL is variable, timings of outputting the test output data TDout from a plurality of test interface circuits provided in correspondence with a plurality of DRAM cores having different column latencies CL can be made coincide with each other.

In the semiconductor integrated circuit device according to the second embodiment as described above, the operation test can be conducted simultaneously on a plurality of DRAM cores having different column latencies CL and the same operation frequency irrespective of the memory capacities and data bit widths. Further, the result of the operation test can be outputted as judging flag data having the same number of bits as that of the test output data TDout.

As described in the first embodiment, by setting the test address TAD, even in the case where the plurality of DRAM cores have different memory capacities and data bit widths, a test can be simultaneously conducted on the DRAM cores.

Third Embodiment

In a third embodiment, a case where a plurality of DRAM cores mounted on the same semiconductor integrated circuit device have the same column latency CL but have different operation frequencies will be described. Although the DRAM cores may have the same memory capacity and the same data bit width or different memory capacities and different data bit widths as in the first embodiment, as an example, a case where the three DRAM cores MCR0 to MCR2 have memory capacities and data bit widths similar to those in the first embodiment will be described.

Figure 13:
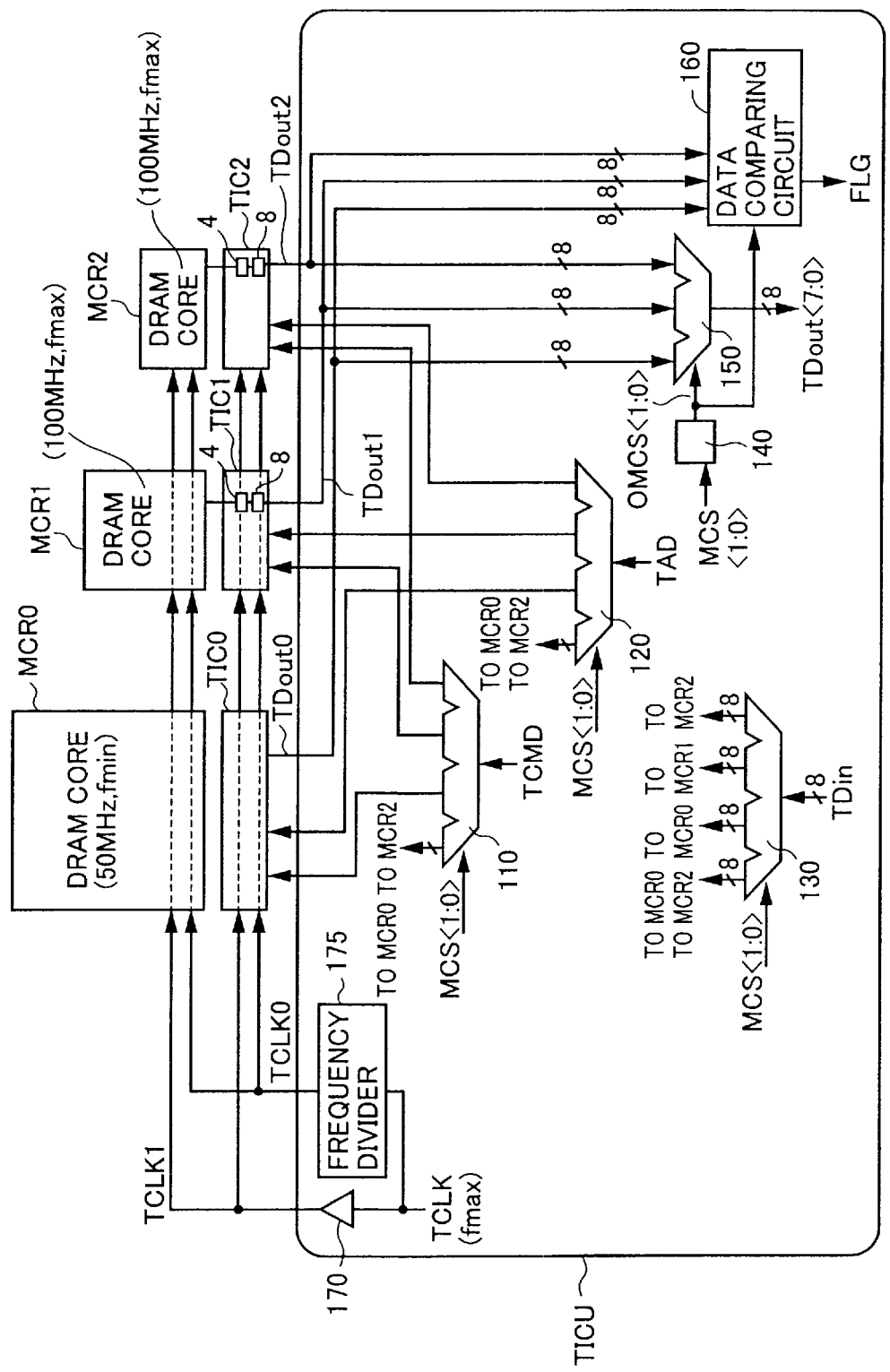
FIG. 13 is a block diagram showing the configuration of a portion related to the test interface circuit of a semiconductor integrated circuit device according to a third embodiment of the invention.

FIG. 13 shows the configuration of a portion related to a test interface circuit in a semiconductor integrated circuit device according to the third embodiment of the invention.

Referring to FIG. 13, it is assumed that the operation frequency of the DRAM core MCR0 is 50 MHz and the operating frequency of each of the DRAM cores MCR1 and MCR2 is 100 MHz which is twice as high as that of the DRAM core MCR0. In the following, the highest operation frequency among the operation frequencies of the plurality of DRAM cores will be described as "fmax". The operation frequency of each of the DRAM cores will be indicated by (1/L) times of the highest frequency fmax (L: natural number). In FIG. 13. the column latency CL of each of the DRAM cores MCR0 to MCR2 is two.

The frequency of the test clock signal TCLK supplied from the outside by a memory tester or the like is set in accordance with the highest frequency fmax. That is, the frequency of the test clock signal TCLK is set to 100 MHz which is the operation frequency of each of the DRAM cores MCR1 and MCR2.

The upper test interface circuit TICU has: a clock buffer 170 which receives the test clock signal TCLK and generates the internal test dock signal TCLK1 having the same frequency; and a frequency dividing circuit 175 for dividing the frequency of the test clock signal TCLK to generate an internal test clock signal TCLK0. In the case of FIG. 13, the frequency dividing circuit 175 divides the frequency of the test clock signal TCLK into two (L=2) so that the frequency of the internal test clock signal TCLK0 is set to 50 MHz which is equal to the operation frequency of the DRAM core MCR0, thereby generating the internal test clock signal TCLK0. The delay amount in the clock buffer 170 is adjusted so that the phases of the internal test clock signals TCLK0 and TCLK1 synchronize with each other.

The internal test clock signals TCLK0 and TCLK1 generated as described above are supplied to each of the DRAM core and the test interface circuit. In the third embodiment, the configuration of each of the test interface circuits TIC0 to TIC2 provided in correspondence with the DRAM cores is similar to that in the case of the second embodiment. Specifically, it is sufficient for the test interface circuit corresponding to the DRAM core having a relatively high operation frequency to adopt the configuration of the test interface circuit TICa shown in FIG. 9, including the data shifting circuit 8 for shifting an output of the read data selection circuit 4 in accordance with a difference in the operation frequencies.

Figure 14:
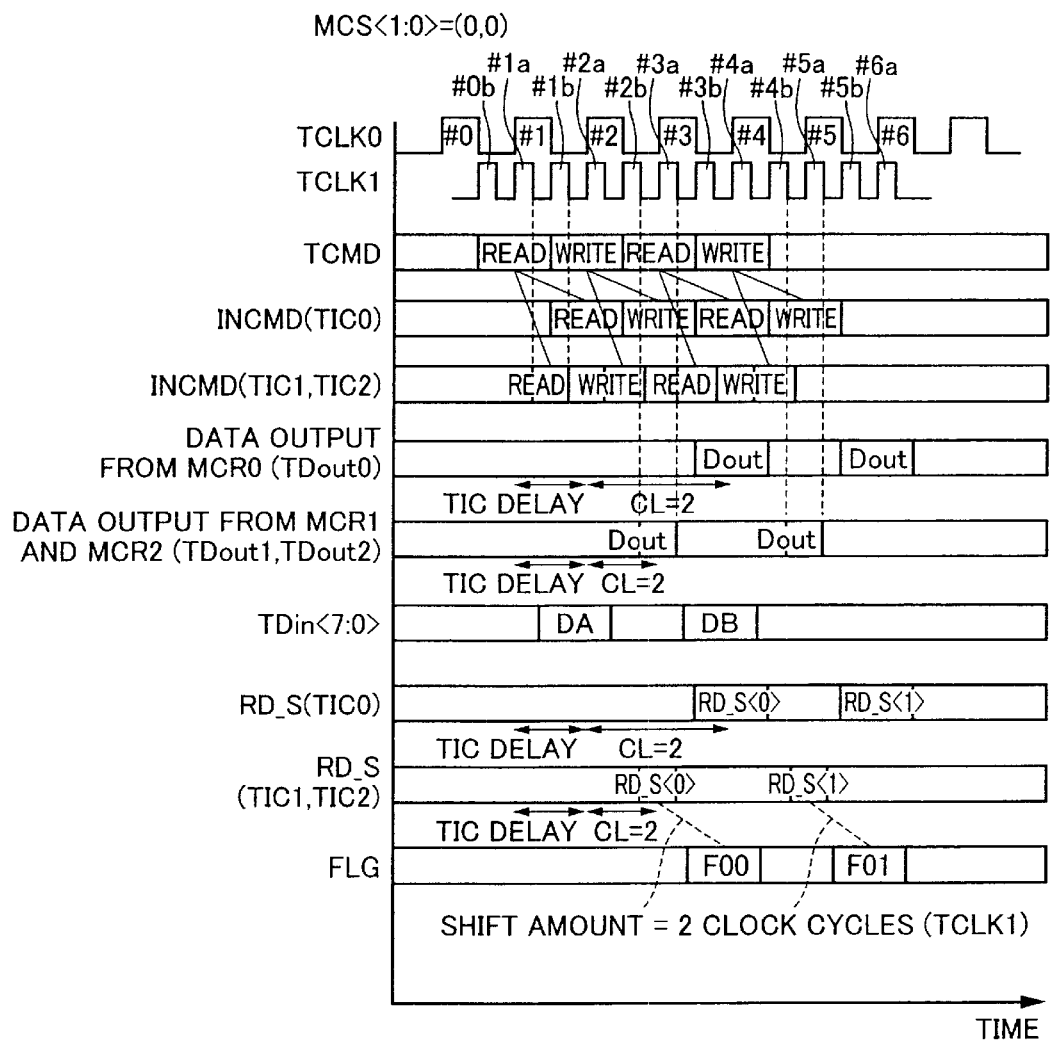
FIG. 14 is a timing chart for explaining the operation of the test interface circuit according to the third embodiment.

FIG. 14 is a timing chart for describing operations of the test interface circuit according to the third embodiment.

In FIG. 14, the clock cycles of the internal test clock signal TCLK0 of which frequency has been divided are written as #0, #1, #2, . . . and the clock cycles of the internal test clock signal TCLK1 having the same frequency as that of the test clock signal TCLK are written as #0b, #1a, #1b, #2a, #2b, . . .

In FIG. 14, it is assumed that the memory core selection signal MCS<1:0> is set to (0, 0) and all of the DRAM cores MCR0, MCR1, and MCR2 are targeted for the operation test. In a manner similar to the case of FIG. 11, in the case where the operation test is a precondition, the configuration of the test interface circuit can be simplified by not providing the selector 140.

In clock cycle #1a (#1), the test control signal TCMD indicative of the read command READ is supplied from a memory tester or the like on the outside.

In response to the read command READ, the internal command INCMD indicative of the read command READ is generated to the test interface circuit TIC0 corresponding to the DRAM core MCR0. By the read command READ, in clock cycle #4 after elapse of two clock cycles of the internal test dock signal TCLK0, read data Dout is outputted from the DRAM core MCR0.

On the other hand, in each of the DRAM cores MCR0 and MCR1 which operate in response to the internal test clock signal TCLK1, in clock cycle #1b after elapse of one clock cycle of the internal test clock signal TCLK1 from the clock cycle #1a, the read command READ is given by the internal command INCMD. A timing of data output from the DRAM cores MCR1 and MCR2 is in clock cycle #3a after elapse of TIC delay in the test interface circuit and CL of two clock cycles (internal test clock signal TCLK1).

In order to synchronize output timings of test data from the DRAM cores, in the test interface circuits TIC1 and TIC2, by setting the data shift amount in the data shifting circuit 8 to an amount of two clock cycles of the internal test clock signal TCLK1, an output timing of test output data from the DRAM core MCR0 and that of test output data from the DRAM cores MCR1 and MCR2 can be synchronized.

Since the memory core selection signal MCS<1:0> is set to (0, 0), the result of comparison in each of the bits in the 8-bit test output data outputted from each of the DRAM cores MCR0 to MCR2 is outputted as judging flag data FLG(F00).

In clock cycle #2 (#2a), the test control signal TCMD indicative of the write command WRITE is supplied from a memory tester or the like on the outside. In response to the write command WRITE, in clock cycle #3, the internal command INCMD indicative of the write command WRITE is generated to the DRAM core MCR0. Similarly, in clock cycle #2b, the internal command INCMD indicative of the write command WRITE is generated to the DRAM cores MCR1 and MCR2. With respect to the data inputting operation to all of the DRAM cores, when the DRAM cores have different memory capacities and different data bit widths, by setting the row address RA and the column address CA as shown in the first embodiment, test data can be written by sharing the test address TAD.

Since an operation performed in response to the write command WRITE inputted as the test control signal TCMD from a memory tester or the like on the outside in clock cycle #4 (#4a) is similar to that performed in response to the write command WRITE inputted in clock cycle #2 (#2a), its description is not repeated. Since the operation performed in response to the read command READ given again in the clock cycle #3 is the same as that performed in response to the read command READ inputted in the clock cycle #1, its detailed description is not repeated here.

It is sufficient to construct the data shifting circuit 8 in FIG. 13 in a manner similar to the data shifting circuit 8 illustrated in FIG. 12 and operate each of the flip flops FF-1 to FF-m in response to the internal test clock signal TCLX1 corresponding to the highest frequency fmax. Further, a shift amount setting signal SFT<m:0> is set by the mode register 2 so that the shift amount corresponds to two clock cycles of the internal test clock signal TCLK1.

Modification of Third Embodiment

The construction of the third embodiment can be also applied to a case where both operation frequencies and column latencies are different.

In this case as well, the data shifting circuit 8 is constructed in a manner similar to the data shifting circuit 8 illustrated in FIG: 12. The operation timing of each of the flip flops FF-1 to FF-m is controlled by the internal test clock signal TCLK1 corresponding to the highest frequency fmax. Further, it is sufficient to set the shift amount by the shift amount setting signal SFT<m:0> in the following manner.

The operation frequency, column latency, and shift amount of the n-th (n: integer from 0 to N) DRAM core among a plurality of DRAM cores are written as f(n), CL(n), and S(n), respectively. First, in accordance with the equation (2), a parameter P(n) of each of the DRAM cores is calculated.

$$P(n)=(fmax/f(n))\cdot CL(n) \quad (2)$$

When the largest parameter P(n) among the parameters P(n) corresponding to the plurality of DRAM cores is set as Pmax, the shift amount S(n) in each of the DRAM cores is set by the equation (3).

$$S(n)=Pmax-P(n) \quad (3)$$

The value of S(n) obtained by the equation (3) denotes the number of clock cycles of the internal test clock signal TCLK1.

For example, when the equations (2) and (3) are applied to the configuration described by referring to FIG. 13, the parameters in the DRAM cores MCR0, MCR1, and MCR2 are calculated as P(0)=4, P(1)=2, and P(2)=2, respectively, and Pmax is therefore 4(MCR0). As shown in FIG. 14, it is sufficient to execute data shifting of two clock cycles of the internal test clock signal TCLK1 in the data shifting circuit 8 in each of the test interface circuits TIC1 and TIC2 corresponding to the DRAM cores MCR1 and MCR2.

It is sufficient to store the calculated shift amount S(n) into, for example, the mode register 2 in the test interface circuit TICa illustrated in FIG. 9. Consequently, the test output data from the plurality of DRAM cores can be outputted by the test interface circuit at the same timing in the case where the plurality of DRAM cores having different column latencies and different operation frequencies are mounted.

As described above, in the semiconductor integrated circuit device according to the third embodiment, an operation test can be conducted simultaneously on a plurality of DRAM cores having different operation frequencies. Further, also in the case where the column latencies CL are different, an operation test can be conducted simultaneously on the plurality of DRAM cores. As described in the first embodiment, by setting the test address TAD, also in the case where the plurality of DRAM cores have different memory capacities and data bit widths, the DRAM cores can be simultaneously tested.

As also shown in FIG. 14, it has been described on assumption that the test interface circuits TIC0 to TIC2 corresponding to the DRAM cores MR0 to MR2 of different operation frequencies have the same TIC delay. In practice, however, a case such that the TIC delay which occurs in each of the test interface circuits varies according to the operation frequency of the corresponding memory core can be considered. Operations dealing with such a case will be described as follows.

First, the TIC delay in each of the test interface circuits is converted to the number of clock cycles of the internal test clock signal TCLK1 corresponding to the highest frequency fmax. Specifically, when the TIC delay amount in the test interface circuit corresponding to the n-th (n: integer from 0 to N) DRAM core is set as ATIC(n) [sec] and the cycle of the internal test clock signal TCLK1 is set as Tmax (Tmax= 1/fmax) [sec], the parameter PTIC(n)=ΔTIC(n)/Tmax is calculated with respect to each of the test interface circuits. The maximum parameter PTIC(n) among the parameters PTIC(n) corresponding to the test interface circuits is set as PTmax.

In each of the test interface circuits, ΔPTIC(n)=PTmax−PTIC(n) is calculated. ΔPTIC(n) corresponds to the number of clock cycles of the internal test dock signal TCLK1 in a test interface circuit having a relatively small T1C delay, which is necessary to be adjusted to eliminate the TIC delay difference and to make the data output timings coincide with each other.

By adding ΔPTIC(n) obtained as described above to the shift amount S(n) calculated by the equation (3), even in the case where there is a TIC delay difference among the test interface circuits corresponding to the DRAM cores, the test output data from the plurality of DRAM cores can be outputted at the same timing.

Alternately, by using a construction such that a shift circuit is newly disposed between a test interface circuit and a corresponding DRAM core to delay transmission of the test control signal TCMD from the test interface circuit to the DRAM core only by a period corresponding to ΔPTIC (n), the influence of the TIC delay difference can be solved.

Fourth Embodiment

In the first to third embodiments of the invention, the configuration of applying the upper test interface circuit TICU to the test control signal TCMD or the like supplied from a memory tester or the like on the outside via the test pin terminal group TPG has been described.

Figure 15:
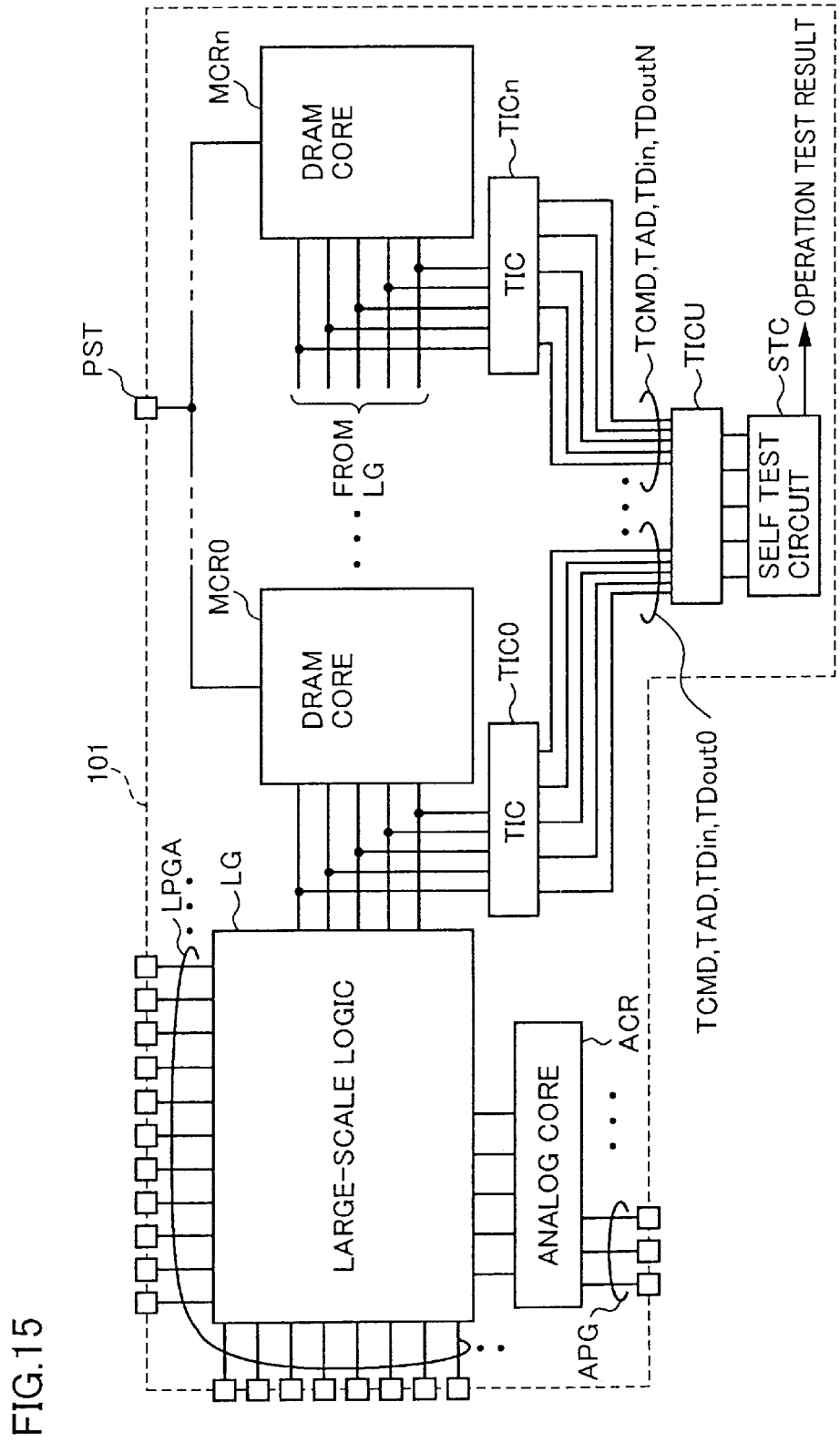
FIG. 15 is a schematic block diagram showing the configuration of a semiconductor integrated circuit device 101 according to a fourth embodiment of the invention.

FIG. 15 is a schematic block diagram showing the configuration of a semiconductor integrated circuit device 101 according to the fourth embodiment of the invention.

Referring to FIG. 15, the semiconductor integrated circuit device 101 is obtained by adding a self test circuit STC for generating the test control signal TCMD, test address TAD, and the like to the semiconductor integrated circuit device 100 illustrated in FIG. 1. In the semiconductor integrated circuit device 101, the test control signal TCMD, test address TAD, and the like are not supplied from the outside via the test pin terminal group TPG but are executed by the self test circuit STC on the basis of a BIST (Built In Self Test).

The result of an operation test can be outputted to the outside by using an external pin terminal group LPGA either directly from the self test circuit STC or via a large-scale logic LG.

With such a configuration, the single self test circuit is shared by the plurality of DRAM cores and the operation test based on the BIST function can be conducted. Any of the configurations described in the first to third embodiments can be applied as the configuration at the post stage of the upper test interface circuit TICU.

Although a RAM-mounted system LSI having therein a DRAM core as a memory core has been described as a representative example of the semiconductor integrated circuit device in the first to fourth embodiments, the invention is not limited to such a case. For example, the invention can be applied to a configuration in which a memory other than a flash memory is mounted as a memory core. That is, the present invention can be applied to a semiconductor integrated circuit device having a plurality of memory cores integrated on the same semiconductor substrate on which a logic device is mounted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
    a plurality of memory circuits operating synchronously with an operation clock signal and executing a given operation instruction;
    a plurality of test interface circuits provided in correspondence with said plurality of memory circuits, each for supplying said operation instruction as well as inputting and outputting test data from and to a corresponding one of said plurality of memory circuits in an operation test; and
    an upper test interface circuit capable of performing the supply of said operation instruction and the input and output of said test data based on a test operation instruction given on each of said plurality of test interface circuits in said operation test,
    said upper test interface circuit including a data comparing circuit for judging based on comparison among a plurality of data output from said plurality of test interface circuits.

2. The semiconductor integrated circuit device according to claim 1,
    wherein said upper test interface circuit performs the supply of said operation instruction and the input and output of said test data on one of, or each of, said plurality of test interface circuits according to a selection instruction,
    said data comparing circuit operates when said operation instruction indicative of a data reading operation is supplied to each of said plurality of test interface circuits,
    said upper test interface circuit further includes a data selecting circuit which receives said plurality of data output from said plurality of test interface circuits, and said data selecting circuit selectively outputs data from one of said plurality of test interface circuits as said test data in the case where said data reading operation is supplied as said operation instruction to the one of said plurality of test interface circuits.

3. The semiconductor integrated circuit device according to claim 1,
wherein each of said test interface circuits inputs and outputs data of M bits (M: natural number), and
said data comparing circuit outputs judging flag data based a result of comparison in each of the M bits among the data output from said test interface circuits.

4. The semiconductor integrated circuit device according to claim 1,
wherein a memory capacity of at least one of said plurality of memory circuits is larger than that of any of other memory circuits,
said test operation instruction includes a test address for selecting an address in each of said memory circuits in said operation test,
said test address has a plurality of bits corresponding to the memory capacity of said at least one of said plurality of memory circuits, and
said address selection in said other memory circuits is performed according to a part of said plurality of bits.

5. The semiconductor integrated circuit device according to claim 4,
wherein each of said plurality of test interface circuits stops a data writing operation supplied as said operation instruction in accordance with the other bits except for said part in said plurality of bits.

6. The semiconductor integrated circuit device according to claim 1,
wherein each of said memory circuits has a plurality of memory cells arranged in a matrix,
each of said plurality of memory circuits has said memory cell rows of the number which is L times (L: natural number) as many as the smallest number of memory cell rows in said plurality of memory circuits,
each of said plurality of memory cells is divided into L areas each having the same number of memory cell rows in each of said plurality of memory circuits, and
said upper test interface circuit supplies said operation instruction to each of said plurality of memory circuits so as to write the same data into each of said L areas when a data writing operation is instructed as said operation instruction to each of said plurality of test interface circuits at the time of said operation test.

7. The semiconductor integrated circuit device according to claim 1,
wherein each of said test interface circuits inputs and outputs data of M bits (M: natural number),
a data bit width of data which is input and output to and from each of said plurality of memory circuits is wider than M bits,
a data bit width of at least one of said plurality of memory circuits is wider than that of any of other memory circuits,
each of said test interface circuits includes a read data selection circuit for executing test output data selection, by selecting M bits from said data outputted from a corresponding one of said plurality of memory circuits in said operation test,
said read data selection circuit executes said test output data selection in accordance with a read data selection signal of a plurality of bits of the bit number corresponding to the ratio between said data bit width and M in at least said one of said plurality of memory circuits, and
said test output data selection in said other memory circuits is performed according to a part of said plurality of bits, the part being shared by said at least one of memory circuits.

8. The semiconductor integrated circuit device according to claim 1,
wherein a column latency of at least one of said plurality of memory circuits is longer than that of any of other memory circuits,
each of said test interface circuits corresponding to said other memory circuits includes a data shifting circuit for delaying data output from the corresponding memory circuit for a predetermined period and transmitting delayed data to said upper test interface circuit, and
said predetermined period is set according to a difference between the column latency of the corresponding memory circuit and the column latency of said at least one of said plurality of memory circuits.

9. The semiconductor integrated circuit device according to claim 8,
wherein a test clock used as said operation clock signal is received in said operation test,
said data shifting circuit has a plurality of flip flop circuits which are connected in series,
each of said plurality of flip flop circuits transmits data in response to said test clock,
the flip flop circuit at the first stage in said plurality of flip flop circuits receives data output from the corresponding memory circuit, and
said data shifting circuit further includes a selector for receiving data output from said corresponding memory circuit and data respectively output from said plurality of flip flop circuits and outputting one of the data which is selected according to said predetermined period to said upper test interface circuit.

10. The semiconductor integrated circuit device according to claim 1,
wherein said plurality of memory circuits have the same column latency,
at least one of said plurality of memory circuits has a highest operation frequency higher than operation frequencies of other memory circuits,
each of said other memory circuits has an operation frequency which is (1/N) times as high as said highest operation frequency (N: natural number),
said upper test interface circuit further includes:
a clock buffer receiving a test clock having the same frequency as said highest operation frequency and supplying said operation clock to at least one of said memory circuits; and
a frequency dividing circuit for dividing the frequency of said test clock and supplying said operation clock to each of said other memory circuits, and
each of said test interface circuits corresponding to said other memory circuits includes a data shifting circuit for delaying data output from the corresponding memory circuit by a predetermined period according to N and transmitting delayed data to said upper test interface circuit.

11. The semiconductor integrated circuit device according to claim 10, wherein said data shifting circuit has a plurality of flip flop circuits which are connected in series, each of said plurality of flip flop circuits transmits data in response to said test clock, the flip flop circuit at the first stage in said plurality of flip flop circuits receives data output from the corresponding memory circuit, and said data shifting circuit further includes a selector for receiving data output from said corresponding memory circuit and data respectively output from said plurality of flip flop circuits and selectively outputting one of the data to said upper test interface circuit in accordance with said predetermined period.

12. The semiconductor integrated circuit device according to claim 1, wherein a column latency of at least one of said plurality of memory circuits is longer than that of any of other memory circuits, an operation frequency of at least one of said plurality of memory circuits is the highest operation frequency higher than the operation frequency of any of said memory circuits, the operation frequency of each of said other memory circuits is (1/N) times (N: natural number) as high as said highest operation frequency, the upper test interface circuit further includes:
a clock buffer which receives a test clock having the same frequency as said highest operation frequency and supplies said operation clock to said at least one of said memory circuits operating with said highest operation frequency; and
a frequency dividing circuit for dividing the frequency of said test clock and supplying said operation clock to each of said other memory circuits,
each of said test interface circuits includes a data shifting circuit for delaying data output from the corresponding memory circuit by a predetermined period and transmitting delayed data to said upper test interface circuit, and
said predetermined period is set according to a parameter indicated by the product of the column latency of said corresponding memory circuit and N.

13. The semiconductor integrated circuit device according to claim 12, wherein each of said test interface circuits sets said predetermined period based on a difference between the largest value in the parameters corresponding to said plurality of memory circuits and said parameter in the corresponding memory circuit.

14. The semiconductor integrated circuit device according to claim 12, wherein said data shifting circuit has a plurality of flip flop circuits which are connected in series, each of said plurality of flip flop circuits transmits data in response to said test clock, the flip flop circuit at the first stage in said plurality of flip flop circuits receives data output from the corresponding memory circuit, and said data shifting circuit further includes a selector receiving data output from the corresponding memory circuit and data respectively output from said flip flop circuits and selectively outputting one of the data in accordance with said predetermined period to said upper test interface circuit.

15. The semiconductor integrated circuit device according to claim 1, further comprising a self test circuit generating said test operation instruction and supplying said test operation instruction to said upper test interface circuit in said operation test.

16. The semiconductor integrated circuit device according to claim 1, wherein the upper test interface circuit performs the supply of said operation instruction and the input and output of said data to and from each of said plurality of test interface circuits on the basis of said test operation instruction in said operation test, time required for the operation test on at least one of said plurality of memory circuits is loner than that on each of the other memory circuits, and said operation test on said other memory circuits is repeatedly conducted until said operation test on each of said at least one memory circuit is completed.

17. The semiconductor integrated circuit device according to claim 16, wherein a memory capacity of said at least one memory circuit is larger than that of each of said other memory circuits, said test operation instruction includes a test address for executing address selection in each of said memory circuits in said operation test, said test address has m bits (m: integer at least than 2) corresponding to the memory capacity of said at least one memory circuit, and address selection in said other memory circuits is executed in accordance with n bits (n: natural number smaller than m) corresponding to the respective memory capacity of said other memory circuits out of said m bits in said operation test.

* * * * *